(12) United States Patent
Tsurumaru

(10) Patent No.: US 11,175,189 B2
(45) Date of Patent: Nov. 16, 2021

(54) ELECTRONICS DEVICE

(71) Applicant: Renesas Electronics Corporation, Tokyo (JP)

(72) Inventor: Makoto Tsurumaru, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 303 days.

(21) Appl. No.: 16/275,478

(22) Filed: Feb. 14, 2019

(65) Prior Publication Data

US 2019/0178726 A1 Jun. 13, 2019

Related U.S. Application Data

(63) Continuation of application No. 15/055,631, filed on Feb. 28, 2016, now Pat. No. 10,247,616.

(30) Foreign Application Priority Data

Mar. 5, 2015 (JP) .................................. 2015-043381
Dec. 25, 2015 (JP) .................................. 2015-253349

(51) Int. Cl.
*G01K 7/01* (2006.01)
*H01L 27/02* (2006.01)
(Continued)

(52) U.S. Cl.
CPC .................. *G01K 7/01* (2013.01); *G01K 7/22* (2013.01); *G01K 7/42* (2013.01); *H01L 27/0255* (2013.01); *H01L 2224/48091* (2013.01)

(58) Field of Classification Search
CPC ... G01K 7/01; G01K 7/22; G01K 7/42; H01L 27/0255; H01L 2224/48091
See application file for complete search history.

(56) References Cited

U.S. PATENT DOCUMENTS 5,394,019 A    2/1995 Audy
5,726,481 A *  3/1998 Moody ............... H01L 27/0248
                                                            257/467
(Continued)

FOREIGN PATENT DOCUMENTS

EP    2 172 756 A2   4/2010
JP    05-040533 A    2/1993
(Continued)

OTHER PUBLICATIONS

Office Action, dated Apr. 4, 2019, in Japanese Application No. 2015-253349.
(Continued)

*Primary Examiner* — Nathaniel T Woodward
*Assistant Examiner* — Philip L Cotey
(74) *Attorney, Agent, or Firm* — SGPatents PLLC

(57) ABSTRACT

An electronics device includes a power semiconductor device including a temperature detection diode, a first semiconductor integrated circuit device including a detection circuit for detecting VF from the temperature detection diode and a second semiconductor integrated circuit device. The second semiconductor integrated circuit device includes, an outside air temperature acquisition unit which acquires outside air temperature information, a storage which stores temperature characteristic data of the temperature detection diode and a first value based on a signal from the detection circuit at a first temperature and a temperature arithmetic processing unit which calculates a temperature of the power semiconductor device from a third value based on a signal from the detection circuit, the temperature characteristic data, the first temperature acquired by the outside air temperature acquisition unit and the first value.

4 Claims, 35 Drawing Sheets

(51) Int. Cl.
*G01K 7/42* (2006.01)
*G01K 7/22* (2006.01)

(56) References Cited

U.S. PATENT DOCUMENTS

| | | | |
|---|---|---|---|
| 5,993,060 A * | 11/1999 | Sakurai | G01K 15/00 374/1 |
| 7,447,607 B2 | 11/2008 | Schuh et al. | |
| 7,821,041 B2 | 10/2010 | Chung et al. | |
| 8,554,505 B2 | 10/2013 | Vayhinger | |
| 8,821,012 B2 | 9/2014 | Wang | |
| 9,282,945 B2 | 3/2016 | Smith et al. | |
| 9,337,719 B2 * | 5/2016 | Nakamori | H02M 7/48 |
| 9,562,812 B2 * | 2/2017 | Yoshimura | G01K 7/01 |
| 9,995,636 B2 * | 6/2018 | Jeong | G01K 7/01 |
| 2003/0072117 A1 | 4/2003 | Maekawa et al. | |
| 2004/0249544 A1 | 12/2004 | Lohberg | |
| 2006/0106561 A1 | 5/2006 | Thiesen | |
| 2006/0168832 A1 | 8/2006 | Yasui et al. | |
| 2008/0238383 A1 * | 10/2008 | Watanabe | H02M 3/158 323/271 |
| 2009/0051307 A1 * | 2/2009 | Katsuyama | H03K 17/082 318/472 |
| 2012/0025802 A1 * | 2/2012 | Carmen | H05B 47/105 323/320 |
| 2012/0265473 A1 * | 10/2012 | Arisaka | G01K 15/005 702/99 |
| 2013/0060499 A1 * | 3/2013 | Yoshimura | G01K 15/005 702/99 |
| 2013/0136149 A1 | 5/2013 | Soenen et al. | |
| 2015/0023076 A1 * | 1/2015 | Nakamori | H02M 1/32 363/56.03 |
| 2015/0078413 A1 | 3/2015 | Heinrich | |
| 2016/0084717 A1 * | 3/2016 | Jeong | G01K 7/01 374/170 |
| 2017/0016792 A1 | 1/2017 | Shepherd et al. | |

FOREIGN PATENT DOCUMENTS

| | | |
|---|---|---|
| JP | 2003-125588 A | 4/2003 |
| JP | 2006-105870 A | 4/2006 |
| JP | 2008-116233 A | 5/2008 |

OTHER PUBLICATIONS

Extended European Search Report dated Aug. 4, 2016, in European Patent Application No. EP16158177.2.

\* cited by examiner

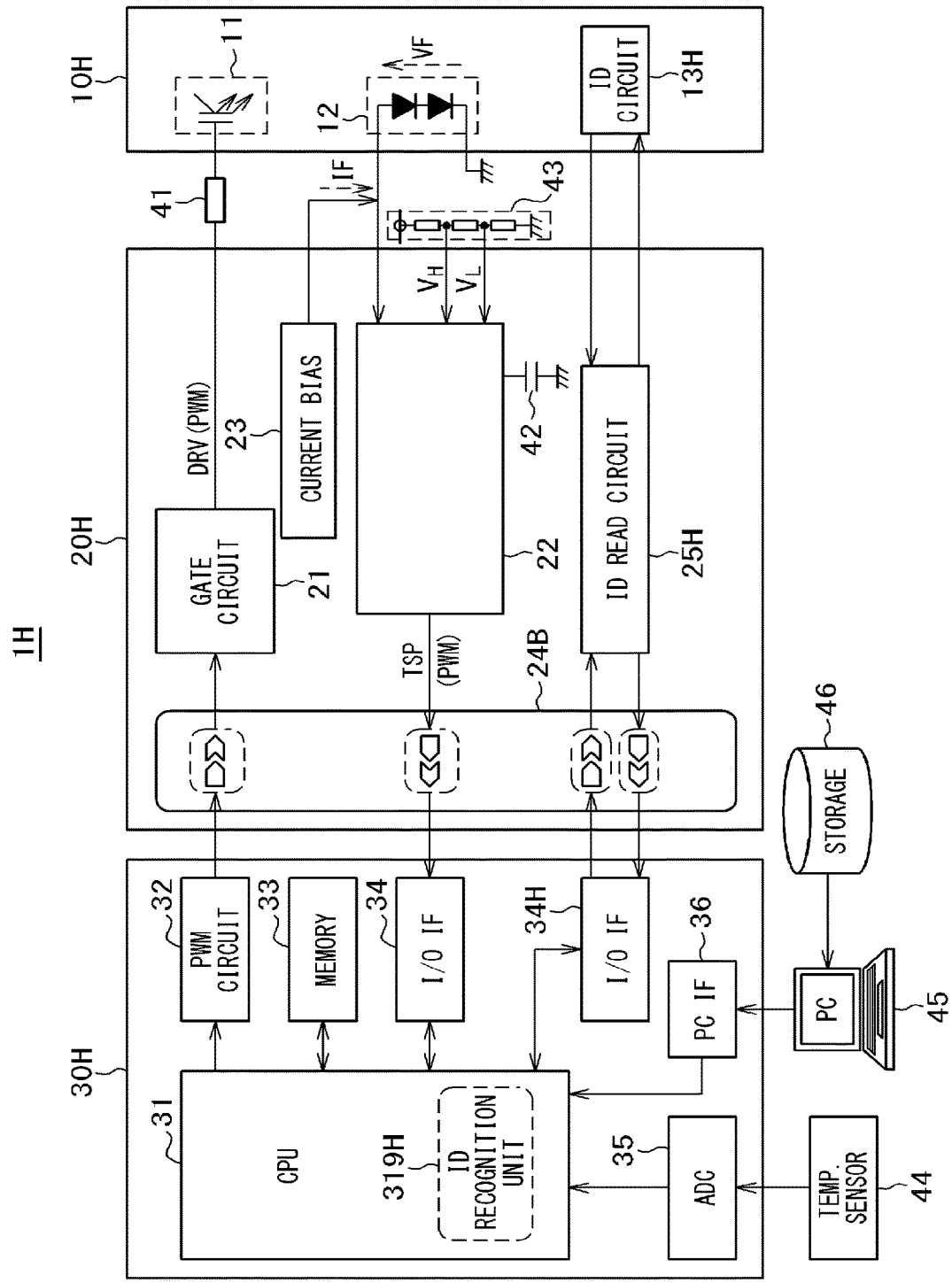

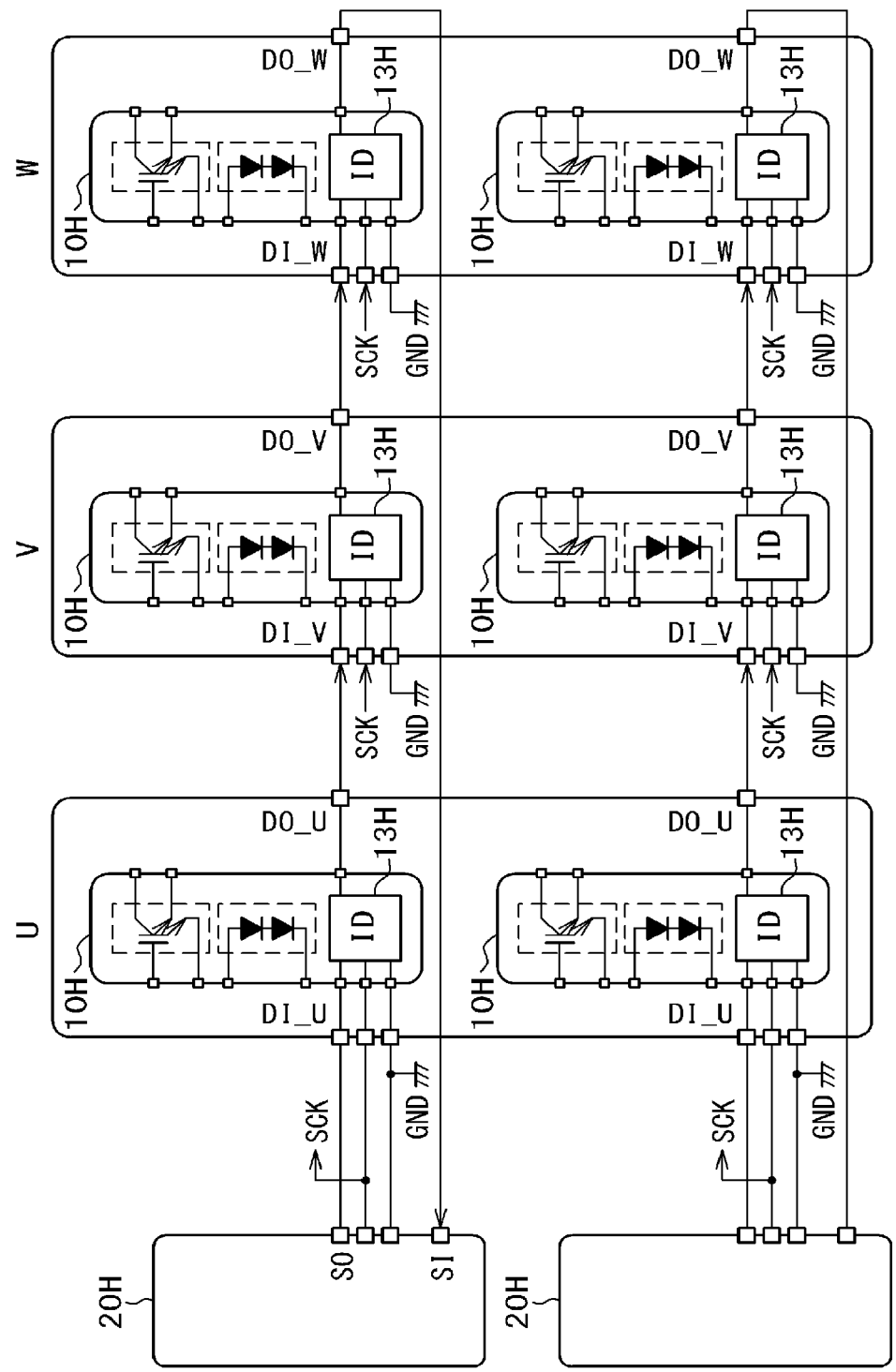

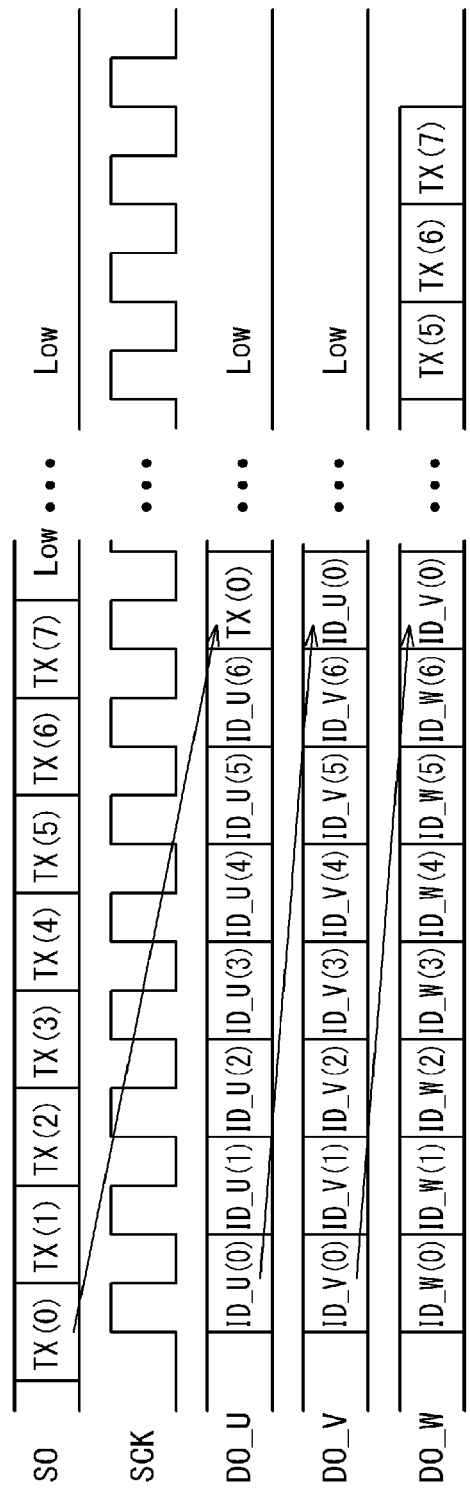

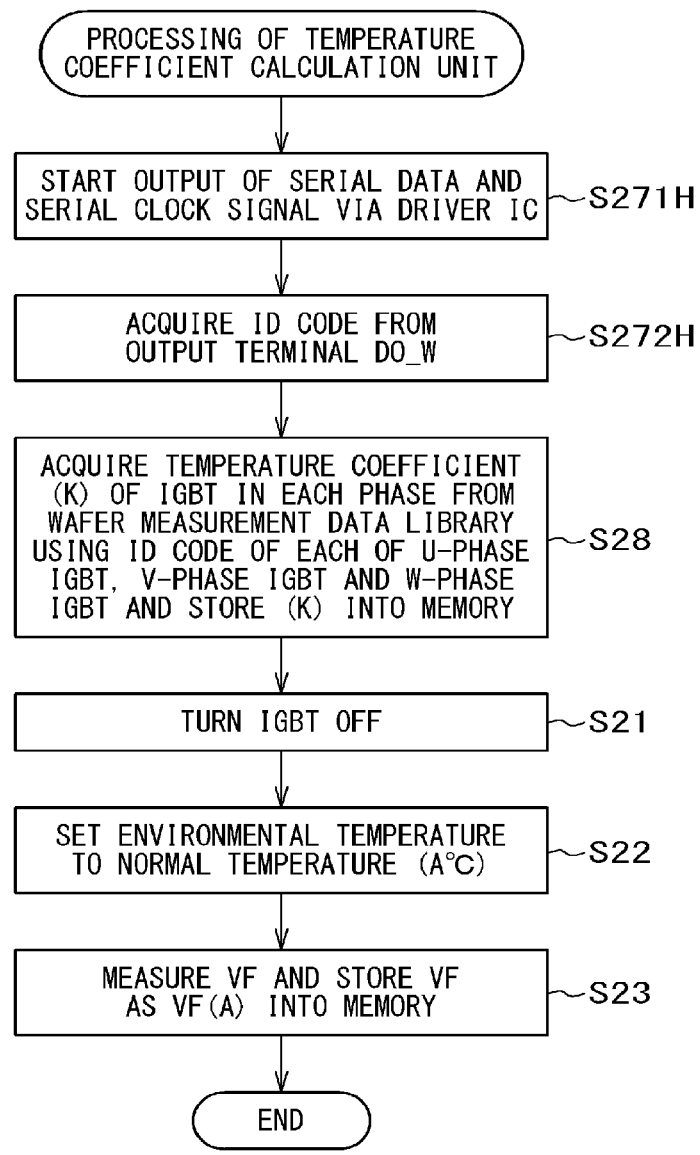

ELECTRONICS DEVICE

CLAIM OF PRIORITY

The present application claims priority from Japanese patent application JP2015-43381 filed on Mar. 5, 2015, and Japanese patent application JP2015-253349 filed on Dec. 25, 2015, the content of which is hereby incorporated by reference into this application.

BACKGROUND

The present disclosure relates to an electronics device and is applicable to the electronics device which includes, for example, a power semiconductor device in which a temperature detection diode is built.

Temperature measurement of a semiconductor chip is performed by utilizing temperature dependency of a forward voltage (VF) of a diode which is installed in the semiconductor chip.

As a related art document, that is, a patent document relevant to the present disclosure, for example, there is proposed Japanese Unexamined Patent Application Publication No. Hei5 (1993)-40533.

SUMMARY

VF of the temperature detection diode varies widely and consequently accuracy of temperature measurement performed in a wide temperature range is reduced.

Other subject matters and novel features of the present disclosure will be clarified from the following description of the present specification and the appended drawings.

In the present disclosure, representative constitutional elements will be briefly described as follows.

That is, according to one embodiment of the present disclosure, there is provided an electronics device which includes a power semiconductor device, a first semiconductor integrated circuit device which drives the power semiconductor device and a second semiconductor integrated circuit device which controls the first semiconductor integrated circuit device. The power semiconductor device includes a switching transistor and a temperature detection diode. The first semiconductor integrated circuit device included a drive circuit which drives the switching transistor and a detection circuit which detects VF from the temperature detection diode. The second semiconductor integrated circuit device includes a control unit which controls the drive circuit, an outside air temperature acquisition unit which acquires outside air temperature information, a storage which stores temperature characteristic data of the temperature detection diode and a first value which is based on a signal from the detection circuit at a first temperature and a temperature arithmetic processing unit which calculates a temperature of the power semiconductor device from a third value which is based on a signal from the detection circuit, the temperature characteristic data, the first temperature which has been acquired by the outside air temperature acquisition unit and the first value.

Owing to provision of the above-mentioned electronics device, it is possible to suppress a reduction in accuracy of temperature measurement in the wide temperature range.

BRIEF DESCRIPTION OF THE DRAWINGS

FIG. 35 is a block diagram illustrating one example of an electronics device according to an eighth example of the present disclosure.

FIG. 36 is a block diagram illustrating one example of connection between a driver IC and an IBGT according to the eighth example of the present disclosure.

FIG. 37 is a timing chart illustrating one example of serial communication in the configuration in FIG. 36.

FIG. 38 is a flowchart illustrating one example of processing of a temperature coefficient calculation unit according to the eighth example of the present disclosure.

DESCRIPTION OF THE PREFERRED EMBODIMENTS

In the following, one embodiment and examples of the present disclosure will be described with reference to the appended drawings. However, in the following description, there are cases where the same numerals are assigned to the same constitutional elements and detailed description thereof is omitted.

An electric motor (a motor) is used as a power source for vehicles such as a hybrid vehicle (HEV) that the electric motor is combined with an internal-combustion engine (a petrol engine), an electric vehicle (EV) and so forth. When driving the electric motor, a power conversion device (an inverter) which performs DC-to-AC conversion is used in order to obtain a predetermined torque, a power source frequency and so forth. An operating temperature of the inverter widely varies depending on a running environment of the vehicle concerned and the temperature of the inverter is increased under the influence of heat generated from the engine, in particular, in the HEV that the inverter is loaded in an engine room. Accordingly, it is feared that the temperature of a switching element (for example, a power semiconductor device) installed in the inverter may be increased under the influence of a steady loss caused by current flowing into an element itself of the power semiconductor device and a switching loss caused by on/off operations in addition to an increase in such ambient temperature as mentioned above and the switching element may be destroyed when the temperature of the switching element exceeds a certain temperature.

In the inverter, a drive circuit which drives the power semiconductor device and a control circuit which controls the drive circuit are used in addition to the power semiconductor device. The drive circuit has an overcurrent protection function and an overheat protection function for the purpose of protecting the power semiconductor device from destruction caused by high temperature and so forth, in addition to protection of a gate drive circuit which drives the power semiconductor device. For example, a temperature detection diode is built in the power semiconductor device, the current is caused to flow from a current source in the drive circuit, and whether the temperature of a chip of the poster semiconductor device is at least a temperature corresponding to a reference voltage is decided by a comparator in the drive circuit by utilizing a current-to-temperature characteristic of the diode (the characteristic that the forward voltage (VF) relative to the same current value is reduced with increasing the temperature). Then, when a value of a temperature detected by the diode has become at least a set value, an alarm signal is output to the control circuit and the signal is also output to the gate drive circuit so as to forcibly shut off the power semiconductor device. Incidentally, when the alarm signal has been output, forced stoppage of the device is performed also by the control circuit.

Figure 1:
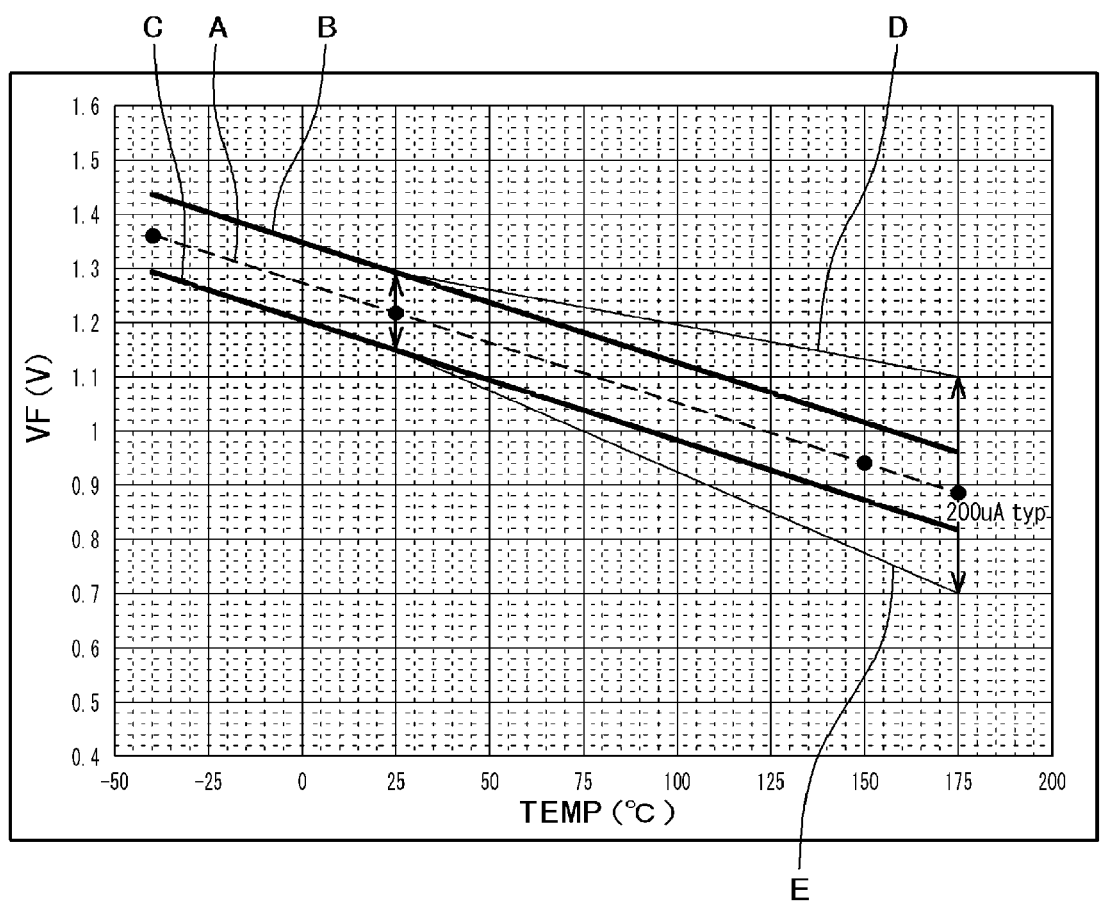
FIG. 1 is a graph illustrating one example of a variation in VF of a temperature detection diode.

The power semiconductor device is, for example, an insulated gate bipolar transistor (IGBT) and includes the switching element and the temperature detection diode which are mounted on one semiconductor substrate. A variation in VF of the temperature detection diode will be described by using FIG. 1. FIG. 1 is a graph illustrating one example of a relation between VF and a temperature of the temperature detection diode (a temperature characteristic). In the example in FIG. 1, the temperature characteristic (the relation between the temperature (° C.) and VF(V) of the temperature detection diode obtained when a bias current of about 200 µA has been caused to flow) when two stages of the temperature detection diodes have been connected in series with each other is illustrated.

In VF of the temperature detection diode of the IGBT, for example, as illustrated in FIG. 1, a variation of about ±6% obtained at a normal temperature (about 25° C.) is increased to a variation of about at least ±20% at about 175° C. when also a temperature coefficient is added. A broken line A indicates a typical value and solid lines B and C are straight lines which run in parallel (the temperature coefficients of B and C are made the same as that of the typical value) with the broken-line A as lines indicative of an upper limit and a lower limit of the variation of about ±6% obtained at about 25° C. Solid lines D and E are straight lines drawn by respectively connecting together the upper limit of the variation of about ±6% obtained at about 25° C. and an upper limit of the variation of about ±20% obtained at about 175° C. and connecting together the lower limit of the variation of about ±6% obtained at about 25° C. and a lower limit of the variation of about ±20% obtained at about 175° C. These lines indicate that a variation in temperature coefficient is increased with increasing the temperature. Since, in general, a set value for detection of temperature abnormality is calculated on the basis of a tolerance of variation of the IGBT, there is such a disadvantage that an allowable operating temperature range of the IGBT is narrowed. Under the circumstance, since the variation in characteristic of the IGBT is corrected when shipment inspection is performed on a board on which the IGBT, the drive circuit, the control circuit and so forth are mounted, an adjustment man-hour taken for changing a circuit constant of a VF detection circuit and so forth is generated.

Embodiment

Figure 2:
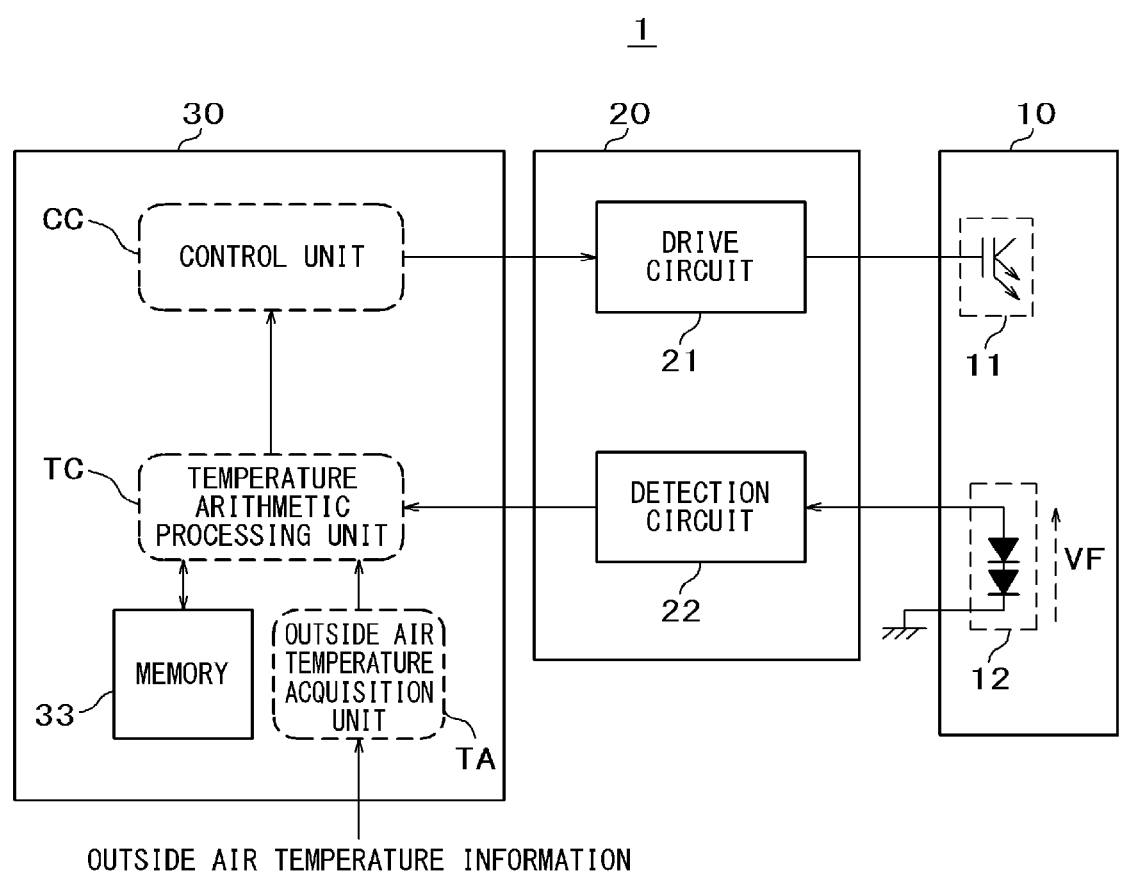
FIG. 2 is a block diagram illustrating one example of an electronics device according to one embodiment.

An electronics device according to one embodiment will be described by using FIG. 2. FIG. 2 is a block diagram illustrating one example of an electronics device according to one embodiment. An electronics device 1 according to one embodiment includes a power semiconductor device 10, a first semiconductor integrated circuit device 20, a second semiconductor integrated circuit device 30 and so forth. The power semiconductor device 10 includes a switching element 11, a temperature detection diode 12 and so forth. The first semiconductor integrated circuit device 20 includes a drive circuit 21 which drives the switching element 11, a detection circuit 22 which detects VF of the temperature detection diode 12 and so forth. The second semiconductor integrated circuit device 30 includes a control unit CC which controls the drive circuit 21, an outside air temperature acquisition unit TA which acquires outside air temperature information, a memory 33 which saves a temperature characteristic (a temperature coefficient) (K) of the temperature detection diode 12 and a first value (VF(A)) which is based on a signal from the detection circuit 22 at a first temperature (A), a temperature arithmetic processing unit TC which calculates a temperature (N) of the power semiconductor device 10 from a third value (VF(N)) and the temperature characteristic (K) based on a signal from the detection circuit 22, and the first temperature (A) and a first value (VF(A) acquired by the outside air temperature acquisition unit TA and so forth.

Since the temperature of the power semiconductor device is calculated by using the temperature characteristic (K) of the power semiconductor device, it is possible to promote an improvement of temperature measurement accuracy. Thereby, when setting an operation allowable range of the power semiconductor device, it is not demanded to set, for example, an abnormality detection temperature low on the basis of a tolerance of variation in VF and then to determine a reference voltage corresponding to the abnormality detection temperature and therefore it is possible to increase the operation allowable range and to optimize (to reduce a chip size) a thermal margin.

First Example

First, one example of a configuration of an electronics device 1A according to the first example of the present disclosure will be described by using FIG. 3.

Figure 3:
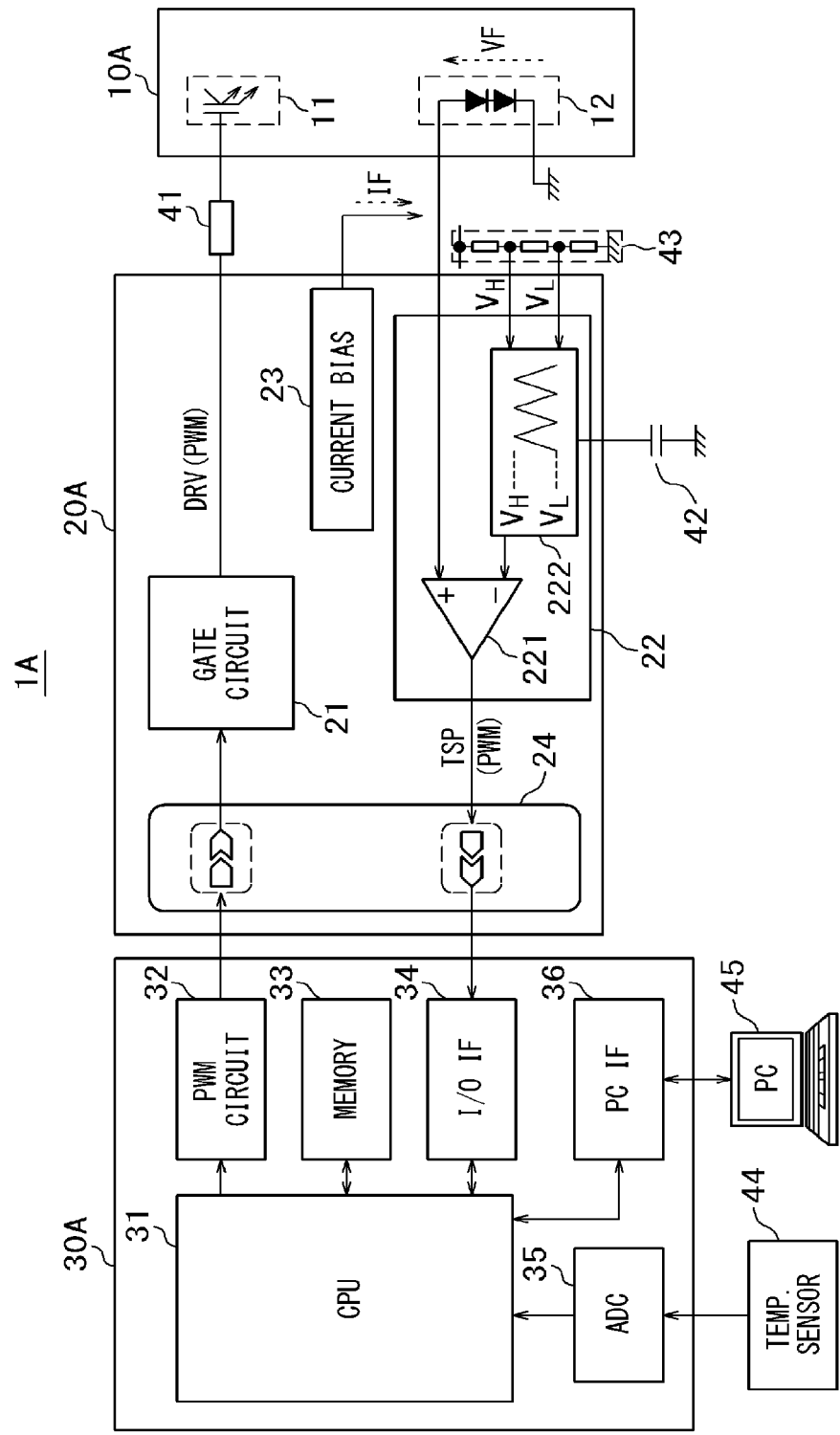
FIG. 3 is a block diagram illustrating one example of an electronics device according to a first example of the present disclosure.

FIG. 3 is a block diagram illustrating one example of the configuration of the electronics device according to the first example. The electronics device 1A according to the first example includes an IGBT 10A which is the power semiconductor device, a driver IC 20A which is the first semiconductor integrated circuit device, a control circuit 30A which is the second semiconductor integrated circuit device and so forth.

The IGBT 10A is formed by mounting the switching element 11, the temperature detection diode 12 and so forth on one semiconductor substrate.

The driver IC 20 is formed by mounting a gate circuit (GATE CIRCUIT) 21 which is the above-mentioned drive circuit 21 for the switching element 11, a temperature detection A/D converter 22 which is the above-mentioned detection circuit 22 for VF of the temperature detection diode 12, a current bias circuit (CURREN BIAS) 23 which supplies a bias current to the temperature detection diode 12 and so forth on one semiconductor substrate. The gate circuit 21 generates a drive signal (DRV) for driving a gate electrode in order to turn the switching element 11 on/off on the basis of a PMW (Pulse Width Modulation) signal from the control circuit 30. A resistor 41 is installed between the gate circuit 21 and the switching element 11.

The temperature detection A/D converter 22 includes a comparator 221, a triangular wave generation circuit 222 and so forth. A capacitor 42 and a group of resistors 43 are installed on the outside of the triangular wave generation circuit 232. The group of resistors 43 generates a reference voltage used for triangular wave generation.

A chip temperature of the IGBT 10A is measured by using the forward voltage (VF) of the temperature detection diode 12 in the IGBT 10A.

A constant current (IF) is caused to flow from the current bias circuit 23 of the driver IC 20A into the temperature detection diode 12 and a PWM temperature sense output signal (TSP) which has been obtained by comparing VF with a triangular wave signal generated from the triangular wave generation circuit 222 by the comparator 221 is transmitted to the control circuit 30 via an isolator 24, and thereby it is possible to measure the temperature from a duty ratio of the PWM signal. The isolator 24 transmits the signal by magnetic coupling which is achieved by insulating an on-chip transformer which is formed by wiring by using an interlayer film.

The control circuit 30A is formed by mounting a CPU 31, a PWM circuit (PSWM CIRCUIT) 32, a memory (MEMORY) 33, an I/O interface (I/O IF) 34 which is an interface input/output unit used for communication with as external device, an A/D converter (ADC) 35, a PC interface (PC I/F) which is an interface unit used for communication with an external PC (Personal Computer) and so forth on one semiconductor substrate and is configured by, for example, a microcomputer unit (MCU). It is preferable to configure the memory 33 by an electrically rewritable nonvolatile memory such as a flash memory and so forth. In addition, it is preferable to store a program that the CPU 31 executes into the above-mentioned or another electrically rewritable nonvolatile memory such as the above-mentioned or another flash memory and so forth. Further, the program may be also stored into the memory 33.

The control circuit 30A will be described by using FIG. 4.

Figure 4:
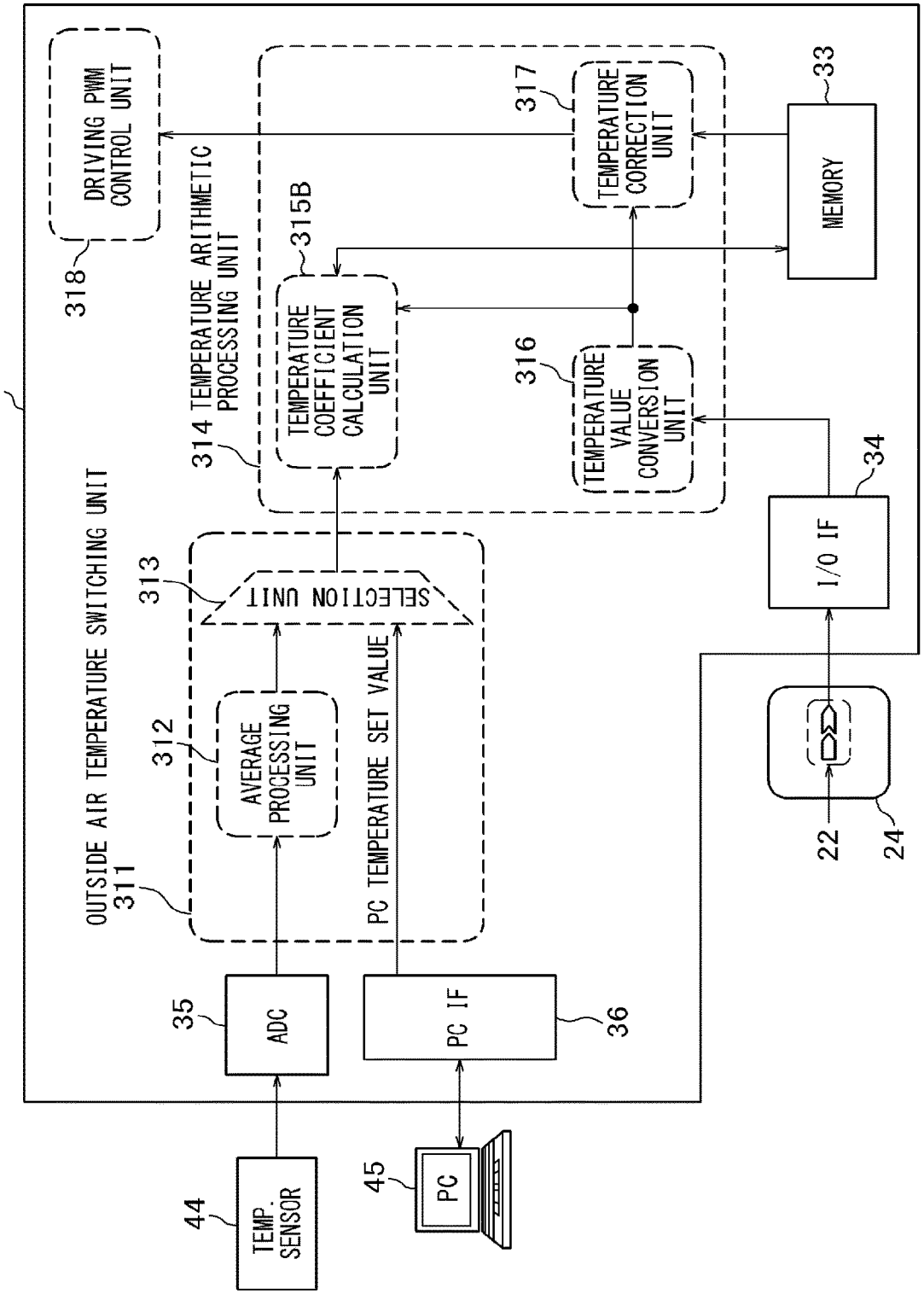
FIG. 4 is a block diagram illustrating one example of a control circuit according to the first example of the present disclosure.

FIG. 4 is a block diagram illustrating one example of a function of the control circuit according to the first example. The control circuit 30A includes an outside air temperature switching unit 311, a temperature arithmetic processing unit 314, a driving PWM control unit 318 and so forth. Although a broken-line block indicates software processing (processing that the CPU 31 executes the program), the processing is not limited to the software processing and may be configured by, for example, hardware processing.

The outside air temperature switching unit 311 includes an average processing unit 312, a selection unit 313 and so forth. A signal which has been noise-removed by converting an output from an outside air temperature detector 44 which is a temperature sensor such as a thermistor and so forth by the A/D converter 35, sampling input signals and averaging values of the plurality of input signals by the average processing unit 312, or a temperature set value of an ambient temperature which is input from a PC 45 via a PC interface 36 is selected by the selection unit 313. As described later, since temperature setting for a space that the ambient temperature of the electronics device 1A which is put in a thermostatic chamber and so forth is settable is performed by the PC 45 or the PC 45 acquires the temperature set value, it is possible for the PC 45 to input the set value of the ambient temperature into the control circuit 30A. Since the ambient temperature may be detected by either the outside air temperature detector 44 or the PC 45, either the outside air temperature detector 44 or the PC 45 may be eliminated. In this case, the selection unit 313 of the outside temperature switching unit 311 may be eliminated. In addition, when the ambient temperature is to be detected by the PC 45, the average processing unit 312 may be eliminated.

The temperature arithmetic processing unit 314 includes a temperature coefficient calculation unit 315, a temperature value conversion unit 316, a temperature correction unit 317 and so forth. Temperature information which is an output from the selection unit 313 and voltage information of the temperature detection diode which has been obtained by converting the output from the temperature detection A/D converter 22 by the temperature value conversion unit 316 are input into the temperature coefficient calculation unit 315. A temperature coefficient which has been calculated by the temperature coefficient calculation unit 315, the temperature information which is the output from the selection unit 313 and the voltage information of the temperature detection diode which has been obtained by converting the output from the temperature detection A/D converter 22 by the temperature value conversion unit 316 are stored into the memory 33. The temperature correction unit 317 corrects the temperature information to temperature information to be used in the driving PWM control unit 318 on the basis of the voltage information of the temperature detection diode which has been obtained by converting the output from the temperature detection A/D converter 22 by the temperature value conversion unit 316 and the information stored in the memory 33.

Incidentally, the program that the CPU 31 executes may be stored into the nonvolatile memory of the control circuit 30A at any of the following times.

(1) At the time of manufacturing the wafer for the control circuit 30A which is the second semiconductor integrated circuit device (2) After encapsulating a chip into a package of the control circuit 30A and before mounting the encapsulated chip on a printed wiring board of the electronics device 1A (3): After mounting the encapsulated chip on the printed wiring board of the electronics device 1A (the program is stored into the nonvolatile memory from the PC 45 via the PC interface 36)

An acquiring method for temperature characteristic data of the temperature detection diode 12 which is one process of a manufacturing method for the electronics device 1A will be described by using FIG. 5 to FIG. 7.

Figure 5:
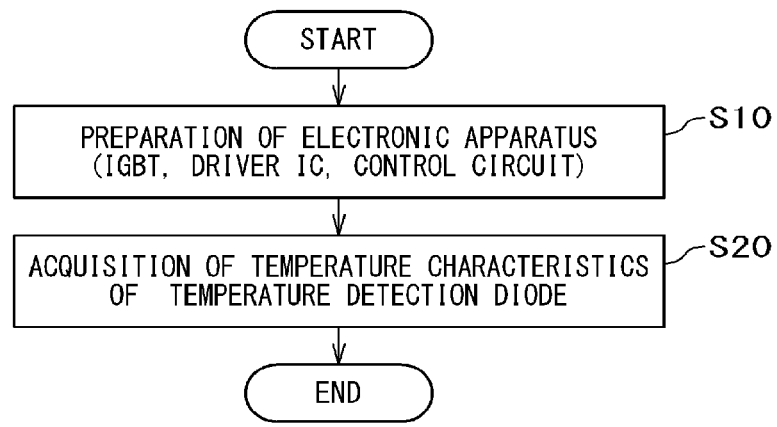
FIG. 5 is a flowchart illustrating one example of a manufacturing method for the electronics device according to the first example of the present disclosure.

FIG. 5 is a flowchart illustrating one example of the manufacturing method for the electronics device according to the first example. FIG. 6 is a graph used for calculating the temperature coefficient in processing of a temperature coefficient calculation unit according to the first example. FIG. 7 is a flowchart illustrating one example of a process for obtaining the temperature coefficient by the processing of the temperature coefficient calculation unit according to the first example.

A process of storing temperature characteristic data of the temperature detection diode which is illustrated in FIG. 5 is performed in a tasting process in a manufacturing process for the electronics device. The electronics device 1A which includes the IGBT 10A, the driver IC 20A, the control circuit 30A and so forth is prepared (step S10). The electronics device 1A is carried into the space that the ambient temperature is settable such as the thermostat chamber and so forth and the outside air temperature detector 44 and the PC 45 are connected to the electronics device 1A. The temperature characteristic of the temperature detection diode 12 is acquired by a later described method (step S20). The outside air temperature detector 44 and the PC 45 are detached from the electronics device 1A and the electronics device 1A is carried out of the ambient temperature settable space.

Figure 6:
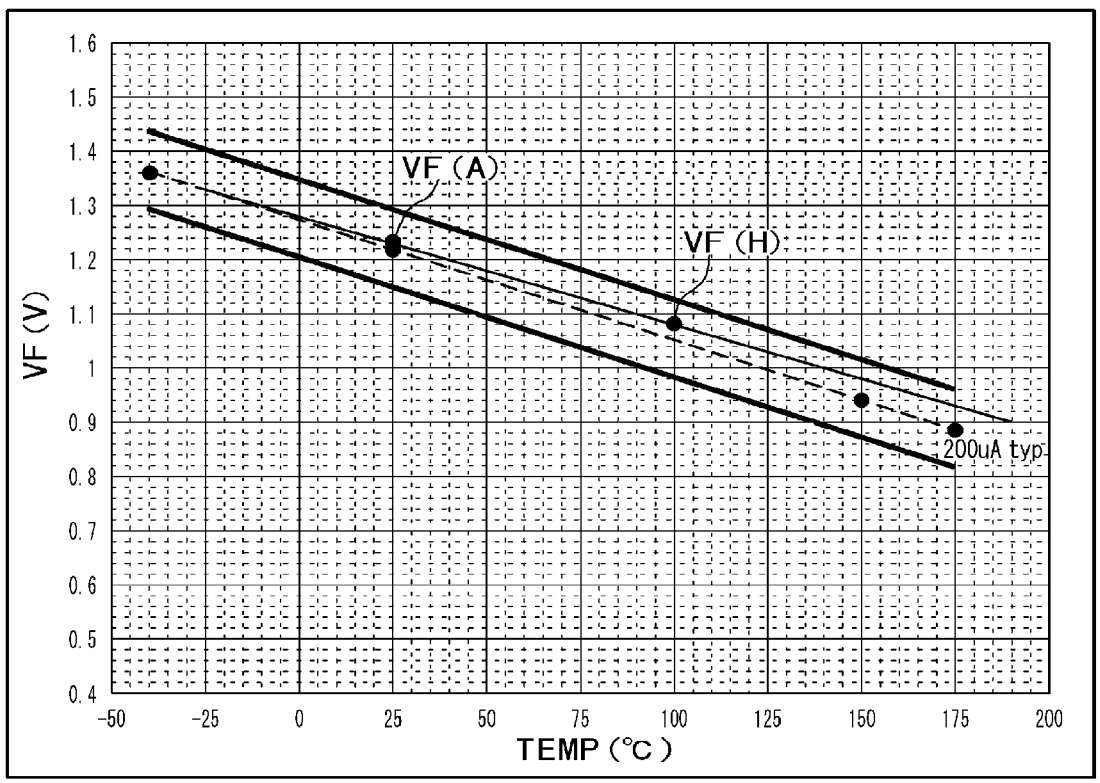
FIG. 6 is a graph illustrating one example of processing of a temperature coefficient calculation unit according to the first example of the present disclosure.

As illustrated in FIG. 6, the temperature coefficient is calculated from the VF measured value (VF(A)) measured at the first temperature (A) and a VF measured value (VF(H)) measured at a second temperature (H). The first temperature (A) is, for example, a normal temperature (about 25° C.) and the second temperature is, for example, a high temperature (about 100° C.).

Figure 7:
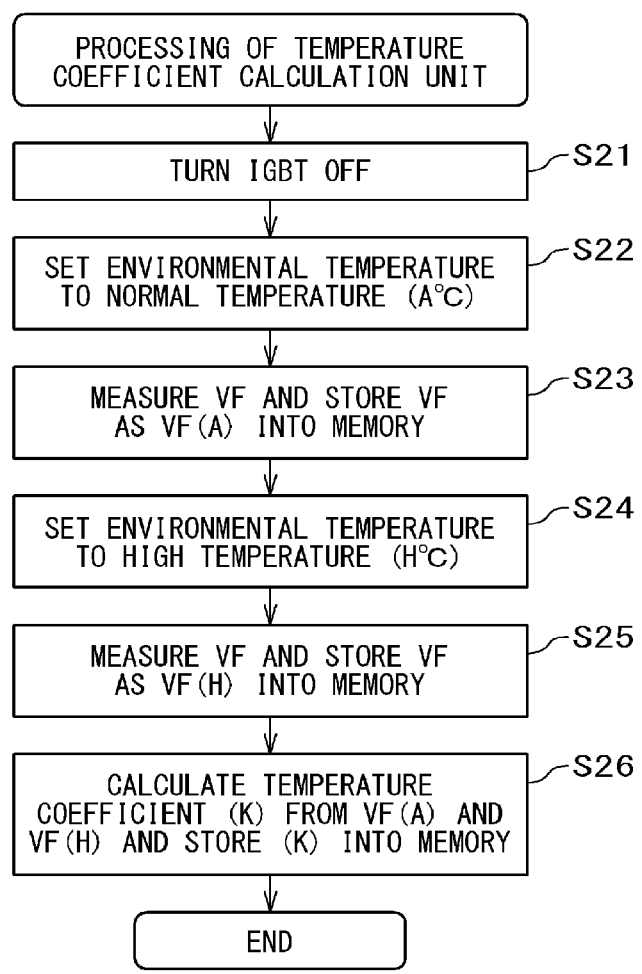
FIG. 7 is a flowchart illustrating one example of the processing of the temperature coefficient calculation unit according to the first example of the present disclosure.

As illustrated in FIG. 7, first, the IGBT 10A is turned off (step S21). The chip temperature of the IGBT 10A is made equivalent to the ambient temperature by turning the IGBT 10A off. Then, the ambient temperature is set to the normal temperature which is the first temperature (A) (step S22). The ambient temperature is input from the outside air temperature detector 44 or the PC 45. Then, VF is calculated by the temperature value conversion unit 316 on the basis of a signal which is indicative of temperature information of the IGBT 10A (the temperature detection diode 12) when the ambient temperature is the first temperature and which is output from the temperature detection A/D converter 22 and is stored into the memory 33 as the first value (the VF measured value) (VF(A)) (step S23). Then, the ambient temperature is set to the high temperature which is the second temperature (H) (step S24). The ambient temperature is input from the outside air temperature detector 44 or the PC 45. Then, VF is calculated by the temperature value conversion unit 316 on the basis of a signal which is indicative of temperature information of the IGBT 10A (the temperature detection diode 12) when the ambient temperature is the second temperature and is output from the temperature detection A/D converter 22 and is stored into the memory 33 as the second value (the VF measured value) (VF(H)) (step S25). The temperature coefficient (K) of the temperature detection diode 12 is calculated from the following numerical formula (1) and is stored into the memory 33 (step S26).

$$K=(VF(H)-VF(A))/(H-A)[mv/° C.] \quad (1)$$

Then, operations of the electronics device 10A performed in normal operation will be described by using FIG. 8 and FIG. 9. Incidentally, although the outside temperature detector 44 and the PC 45 are useful when calculating the temperature coefficient, the outside temperature detector 44 and the PC 45 are not used in normal operation.

Figure 8:
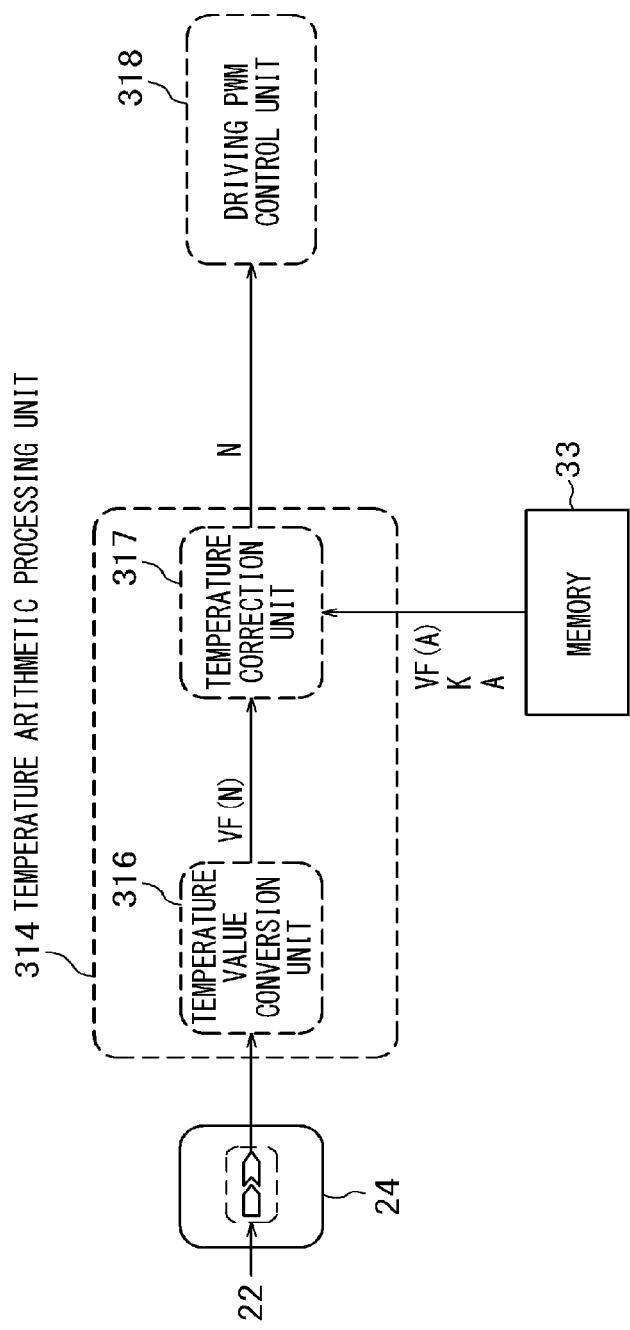
FIG. 8 is a block diagram illustrating one example of a control circuit according to the first example of the present disclosure.

FIG. 8 is a block diagram mainly illustrating one example of a function of the temperature correction unit in the control circuit according to the first example. FIG. 9 is a block diagram mainly illustrating one example of a function of the PWM control unit in the control circuit according to the first example.

A temperature measuring method for the electronics device 10A performed in normal operation is illustrated in FIG. 8.

VF is calculated by the temperature value conversion unit 316 on the basis of the signal which is indicative of the temperature information of the IGBT 10A (the temperature detection diode 12) and is output from the temperature detection A/D converter 22 and is set as the third value (VF(N)). The temperature correction unit 317 calculates a measured temperature (N) of the IGBT 10A from the following numerical formula (2) by using the third value (VF(N)), and the temperature coefficient (K), the first temperature (A) and the first value (N) which are stored in the memory 33.

$$N=(VF(N)-VF(A))/K+A[° \text{ C.}] \qquad (2)$$

Figure 9:
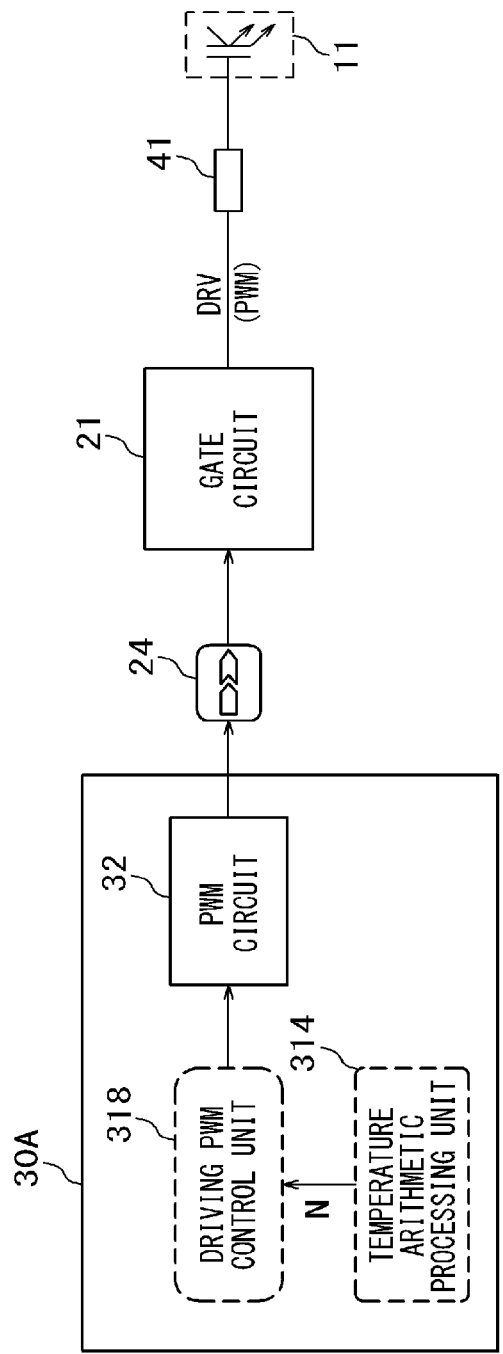
FIG. 9 is a block diagram illustrating one example of the control circuit according to the first example of the present disclosure.

As illustrated in FIG. 9, the driving PWM control unit 318 controls the PWM circuit 32 so as to generate the PWM signal which is the drive signal (DRV) for the switching element 11. In addition, the driving PWM control unit 318 has a function of protecting the IGBT 10A by controlling the PWM circuit 32 so as to suppress driving of the switching element 11 when the temperature has approached a predetermined temperature or by controlling the PWM circuit 32 so as to stop driving of the switching element 11 by deciding that an abnormal state has occurred when the temperature has exceeded the predetermined temperature, in accordance with a result of measurement of the temperature of the IGBT 10A obtained by the temperature arithmetic processing unit 314.

According to the first example, since it is possible to acquire the temperature characteristic of the temperature detection diode, including the characteristics of the entire electronics device such as the characteristics of the temperature detection A/D converter and so forth, highly accurate temperature measurement becomes possible. Thereby, it becomes possible to protect the IGBT at an appropriate temperature.

Second Example

A configuration of an electronics device 1B according to the second example of the present disclosure will be described by using FIG. 10.

Figure 10:
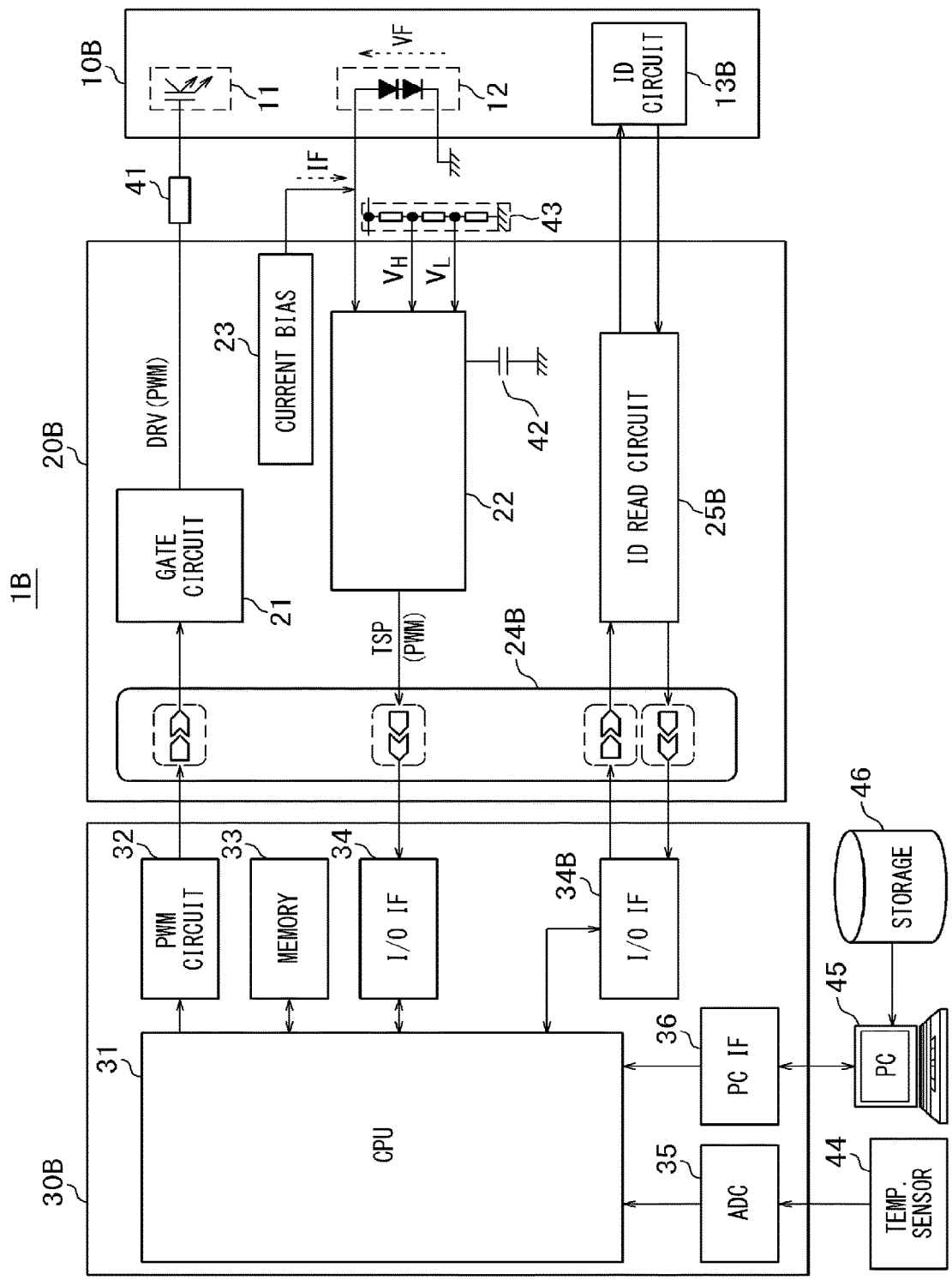
FIG. 10 is a block diagram illustrating one example of an electronics device according to a second example of the present disclosure.

FIG. 10 is a block diagram illustrating one example of the configuration of the electronics device according to the second example.

The electronics device 1B according to the second example includes an IGBT 10B which is the power semiconductor device, a driver IC 20B which is the first semiconductor integrated circuit device, a control circuit 30B which is the second semiconductor integrated circuit device and so forth.

The IGBT 10B includes an ID circuit (ID CIRCUIT) 13B which stores an ID code peculiar to the chip concerned and so forth. Other configurations of the IGBT 10B are the same as those of the IGBT 10A. The ID circuit 13B is configured by a laddered resistor, an electrical fuse and so forth.

The driver IC 20B includes an ID read circuit 25B which reads the ID code out of the ID circuit 13B and so forth. Other configurations of the driver IC 20B are the same as those of the driver IC 20A. The ID read circuit 25B converts a signal indicative of a voltage value from the ID circuit 13B into a PWM signal (a serial digital signal) similarly to the temperature detection A/D converter 22. Although an isolator 24B is the same as the isolator 24 in configuration, the number of the isolators which are installed is increased in the second example.

The control circuit 30B includes an I/O interface 34B, an ID recognition unit 319 and so forth. Other configurations of the control circuit 30B are the same as those of the control circuit 30A. The ID recognition unit 319 recognizes the ID code on the basis of a signal from the ID read circuit 25B.

In a wafer testing process performed when manufacturing the wafer of the IGBT 10B, tests are performed at the normal temperature and at the high temperature and the temperature characteristic data (VF(A), VF(H) and K) of the IGBT 18B which has been obtained in the tests is stored into an external storage 46 as a wafer measurement data library together with the ID code. Incidentally, in the wafer testing process, the ID code is set by cutting the electrical fuse of the ID circuit 13B of the IGBT 10B and so forth.

The control circuit 30B will be described by using FIG. 11.

Figure 11:
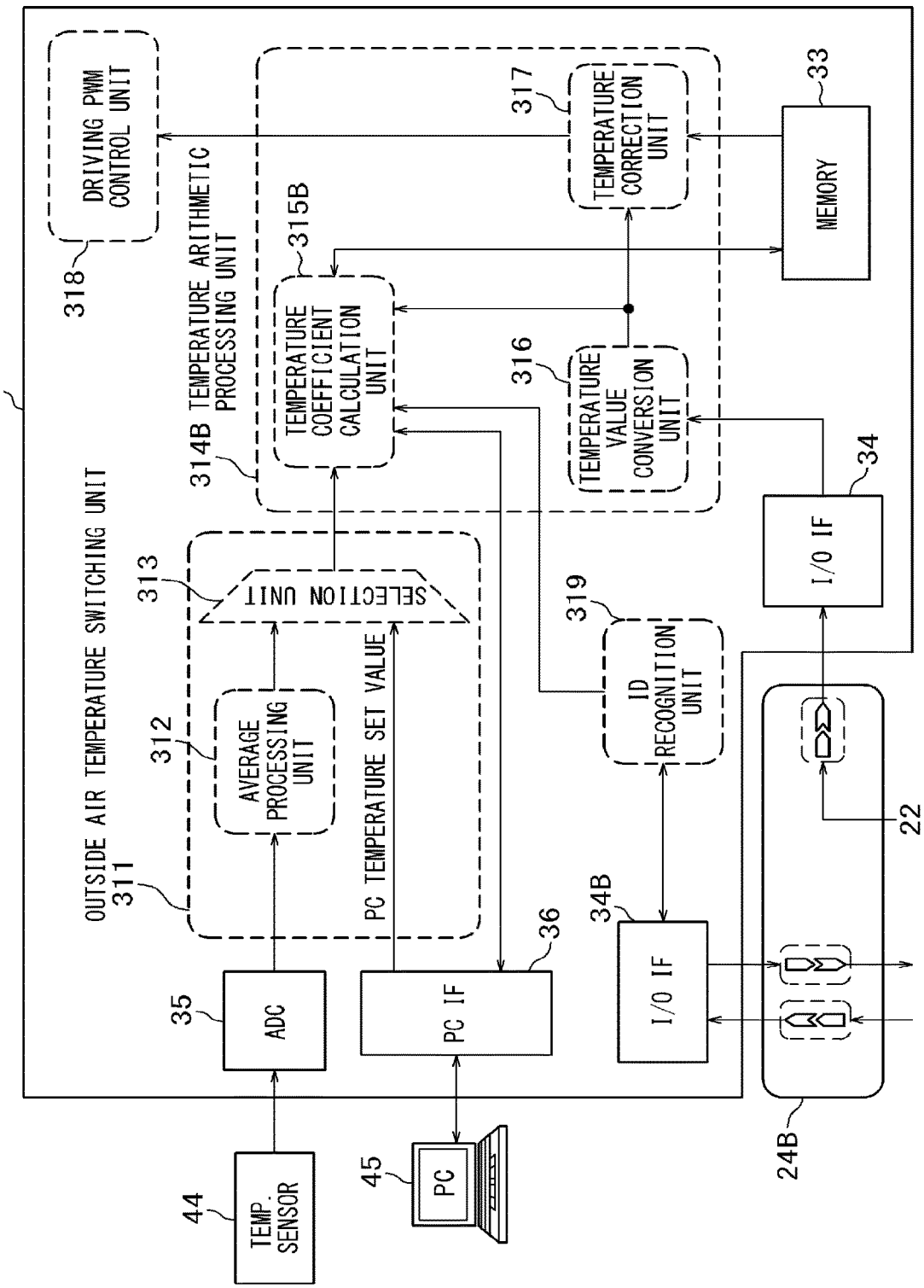
FIG. 11 is a block diagram illustrating one example of a control circuit according to the second example of the present disclosure.

FIG. 11 is a block diagram illustrating one example of a function of the control circuit according to the second example. The control circuit 30B according to the second example is the same as the control circuit 30A with the exception that the temperature characteristic which is input from the PC interface 36 is used in a temperature coefficient calculation unit 315B and the ID recognition unit 319 which recognizes the ID code by reading the ID code via the I/O interface 34B is added. Although a broken-line block indicates software processing (the processing that the CPU 31 executes the program), the processing is not limited to the software processing and may be, for example, hardware processing.

A temperature arithmetic processing unit 314B includes the temperature coefficient calculation unit 315B, the temperature value conversion unit 316, the temperature correction unit 317 and so forth. The temperature information output from the selection unit 313, the voltage information of the temperature detection diode 12 obtained by converting the output from the temperature detection A/D converter 22 by the temperature value conversion unit 316 and the temperature coefficient (K) corresponding to the ID code that the ID recognition unit 319 has acquired from the external storage (STORAGE) 46 which is installed on the outside of the PC 45 and in which the wafer measurement data library is stored are input into the temperature coefficient calculation unit 315B. The temperature coefficient (K), the temperature information (output from the selection unit 313) and the voltage information (of the temperature detection diode 12 obtained by converting the output from the temperature detection A/D converter 22 by the temperature value conversion unit 316) which have been input into the temperature coefficient calculation unit 315B are stored into the memory 33.

An acquiring method for temperature characteristic data of the temperature detection diode 12 which is one process of a manufacturing method for the electronics device 1B according to the second example will be described by using FIG. 12 and FIG. 13.

Figure 12:
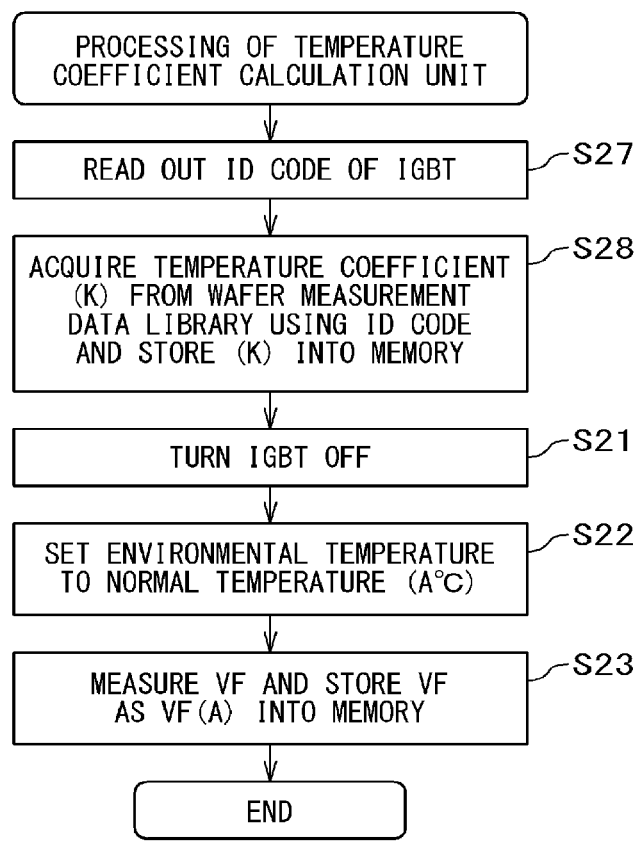
FIG. 12 is a flowchart illustrating one example of processing of a temperature coefficient calculation unit according to the second example of the present disclosure.
Figure 13:
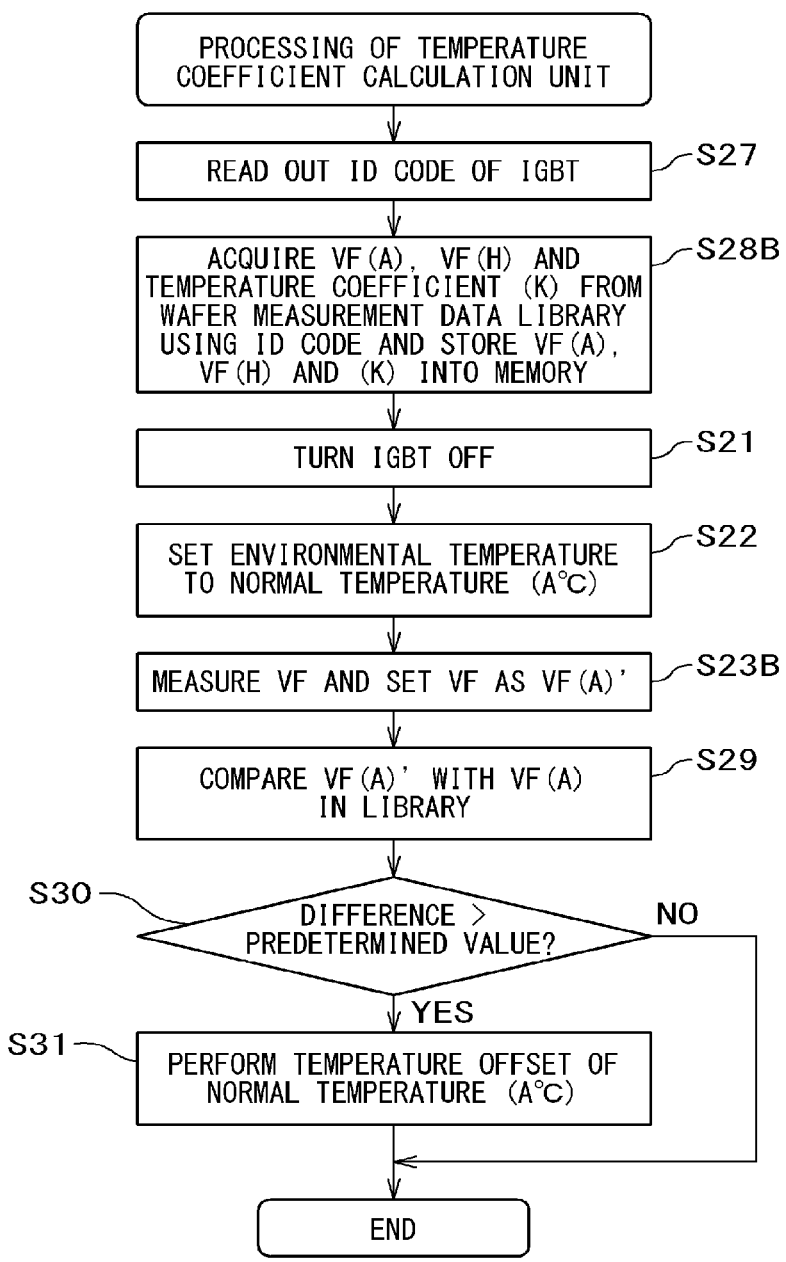
FIG. 13 is a flowchart illustrating one example of the processing of the temperature coefficient calculation unit according to the second example of the present disclosure.

FIG. 12 is a flowchart illustrating one example of processing of the temperature coefficient calculation unit according to the second example. FIG. 13 is a flowchart illustrating one example of the processing of the temperature coefficient calculation unit according to the second example.

The manufacturing method for the electronics device 1B is the same as that in the first embodiment with the exception of provision of step S20. In the following, a process corresponding to step S20 will be described.

First, the ID code of the IGBT 10B is read (step S27). Then, the temperature coefficient (K) is acquired from the external storage 46 in which the wafer measurement data library is stored by using the ID code and is stored into the memory 33 (step S28). Then, the IGBT 10B is turned off (step S21). Then, the ambient temperature is set to the normal temperature which is the first temperature (A) (step S22). The ambient temperature is input from the outside air temperature detector 44 or the PC 45. Then, VF is calculated by the temperature value conversion unit 316 on the basis of the signal which is indicative of the temperature information of the IGBT 10B (the temperature detection diode 12) when the ambient temperature is the first embodiment and is output from the temperature detection A/D converter 22 and is stored into the memory 33 as the first value (VF(A)) (step S23). Incidentally, step S27 and step S28 may be interchanged with step S21 to step S23.

Processing for a case of increasing adjustment accuracy by including the driver IC 20B will be described by using FIG. 13.

First, the ID code of the IGBT 10B is read (step S27). Then, the first value (VF(A)), the second value (VF(H)) and the temperature coefficient (K) are acquired from the external storage 46 that the wafer measurement data library is stored using the ID code and are stored into the memory 33 (step S28). Then, the IGBT 10B is turned off (step S21). Then, the ambient temperature is set to the normal temperature which is the first temperature (A) (step S22). The ambient temperature is input from the outside air temperature detector 44 or the PC 45. Then, VF is calculated by the temperature value conversion unit 316 on the basis of the signal which is indicative of the temperature information of the IGBT 10B (the temperature detection diode 12) when the ambient temperature is the first temperature and is output from the temperature detection A/D converter 22 and is set as a fourth value (VF(A)') (step S23B). Then, the fourth value (VF(A)') is compared with the first value (VF(A)) in the wafer measurement data library (step S29). Then, whether a difference between the fourth value (VF(A)') and the first value (VF(A)) is at least a predetermined value is decided step S30). When the difference is at least the predetermined value (Yes in step S30), temperature offset of the normal temperature A ° C. is performed (step S31). The normal temperature is offset such that the temperature (N) which has been obtained by substituting VF(A)' for VF(N) in the numerical formula (2) is set as a new normal temperature A'. An offset value is a difference between and A' and A. Incidentally, step S27 and step S28B may be interchanged with step S21 to step S23B.

In addition, although in the present example, the temperature coefficient (K) and other values are acquired from the wafer measurement data library stored in the external storage 46 and are stored into the memory 33 in step S28 or step S28B, the temperature coefficients (K) and other values which corresponds to the plurality of ID codes may be stored into the memory 33 in advance before execution of step S27.

The operations of the electronics device 1B performed in normal operation are the same as those of the electronics device 1A.

VF is calculated by the temperature value conversion unit 316 on the basis of the signal which is indicative of the temperature information of the IGBT 10B (the temperature detection diode 12) and is output from the temperature detection A/D converter 22 and is set as the third value (VF(N)). The temperature correction unit 317 calculates the measured temperature (N) of the IGBT 10B from the above-mentioned numerical formula (2) by using the third value (VF(N)), and the temperature coefficient (K), the first temperature (A) and first value (VF(A)) which are stored in the memory 33.

The driving PWM control unit 318 controls the PWM circuit 32 so as to generate the PWM signal which is the drive signal (DRV) for the switching element 11. In addition, the driving PWM control unit 318 has the function of protecting the IGBT 10B by controlling the PWM circuit 32 so as to suppress driving of the switching element 11 when the temperature has approached the predetermined temperature or by controlling the PWM circuit 32 so as to stop driving of the switching element 11 by deciding that the abnormal state has occurred when the temperature has exceeded the predetermined temperature, in accordance with the result of measurement of the temperature of the IGBT 10A obtained by the temperature arithmetic processing unit 314B.

According to the second example, since it is not demanded to acquire the temperature characteristic by changing the ambient temperature as in the first example, it is possible to reduce the adjustment man-hour. In addition, the same advantageous effects as those of the first example are obtained in normal operation.

Third Example

A configuration of an electronics device 1C according to the third example of the present disclosure will be described by using FIG. 14.

Figure 14:
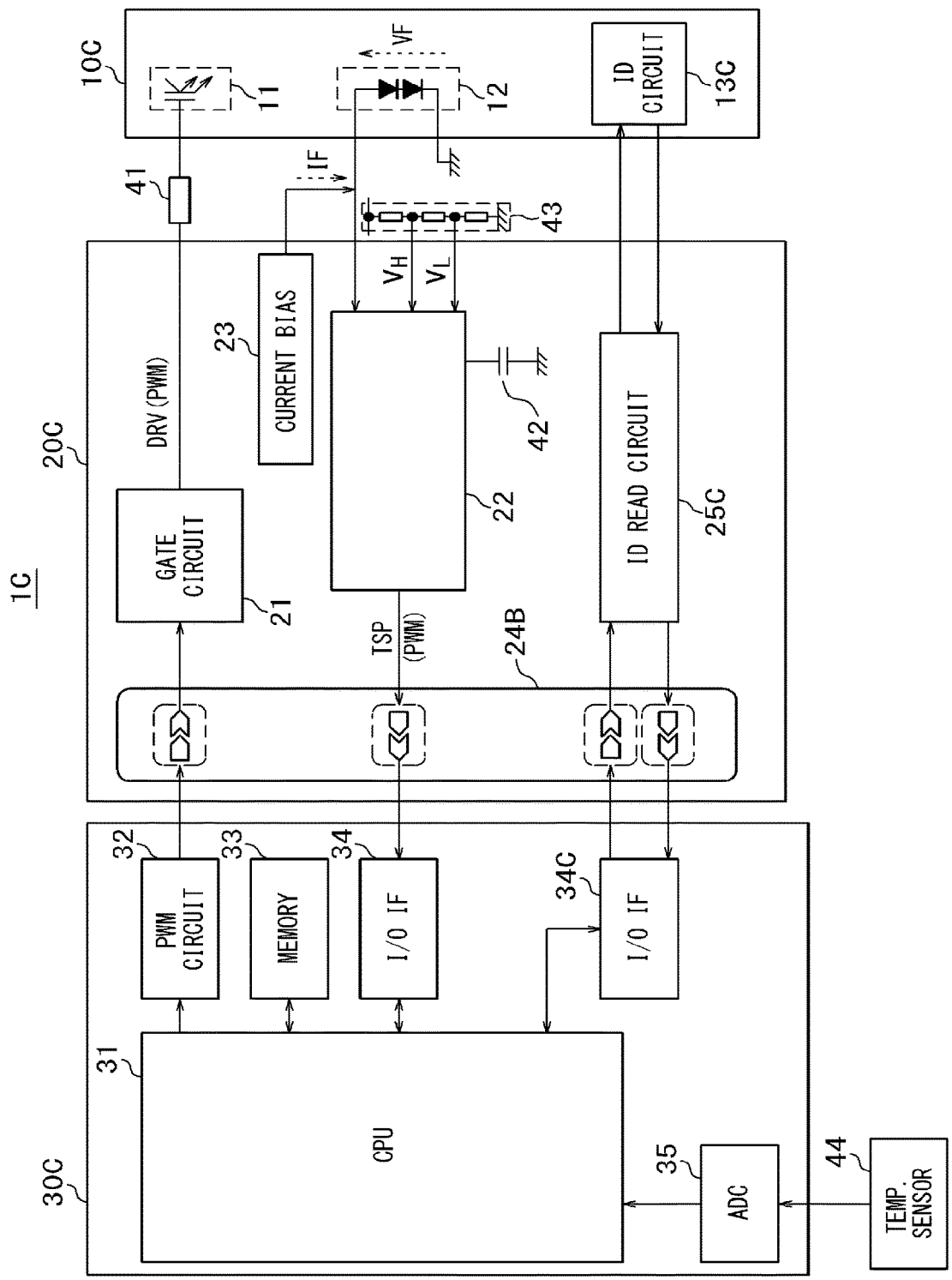
FIG. 14 is a block diagram illustrating one example of an electronics device according to a third example of the present disclosure.

FIG. 14 is a block diagram illustrating one example of the electronics device according to the third example.

The electronics device 1C according to the third example includes a IGBT 10C which is the power semiconductor device, a driver IC 20C which is the first semiconductor integrated circuit device, a control circuit 30C which is the second semiconductor integrated circuit device and so forth.

The IGBT 10C includes an ID circuit (ID CIRCUIT) 13C which stores the temperature characteristic of the temperature detection diode 12 and so forth. Other configurations of the IGBT 10C are the same as those of the IGBT 10B. The ID circuit 13C is configured by the laddered resistor, the electrical fuse and so forth.

The driver 1C 20C includes an ID read circuit 25C which reads the temperature characteristic data out of the ID circuit 13C and so forth. Other configurations of the driver IC 20C are the same as those of the driver IC 20B. Although the ID read circuit 25C is different from the ID read circuit 25B in data to be read out, the ID read circuit 25C is the same as the ID read circuit 25B in configuration.

The control circuit 30C includes an I/O interface 34C, an ID recognition unit 319C and so forth and does not include the PC interface 36. Other configurations of the control circuit 30C are the same as those of the control circuit 30B. The ID recognition unit 319C acquires the temperature characteristic data on the basis of a signal from the ID read circuit 25C.

In a wafer testing process performed when manufacturing the wafer of the IGBT 1C 10C, tests are performed at the normal temperature and at the high temperature, the temperature coefficient (K) is calculated from the temperature characteristics (the first value (VF(A)), the second value (VF(H)), the first temperature (A) and the second temperature (H) of the temperature detection diode 12 of the IGBT 10C which have been obtained in the tests and the temperature coefficient (K) is set by cutting the electrical fuse of the ID circuit 13C and so forth. The first value (VF(A)) and the second value (VF(H)) may be set in place of the temperature coefficient (K) by cutting the electrical fuse and so forth. In this case, it is preferable to set data on difference between a typical value and the first value (VF(A)) of VF at the normal temperature, data on difference between a typical value and the second value (VF(H)) of VF at the high-temperature and reference data. In this case, it is preferable for the ID read circuit 25C to convert the three voltage values from the ID circuit 13C into PWM signals in time division similarly to the temperature detection A/D converter 22.

The control circuit 30C will be described by using FIG. 15.

Figure 15:
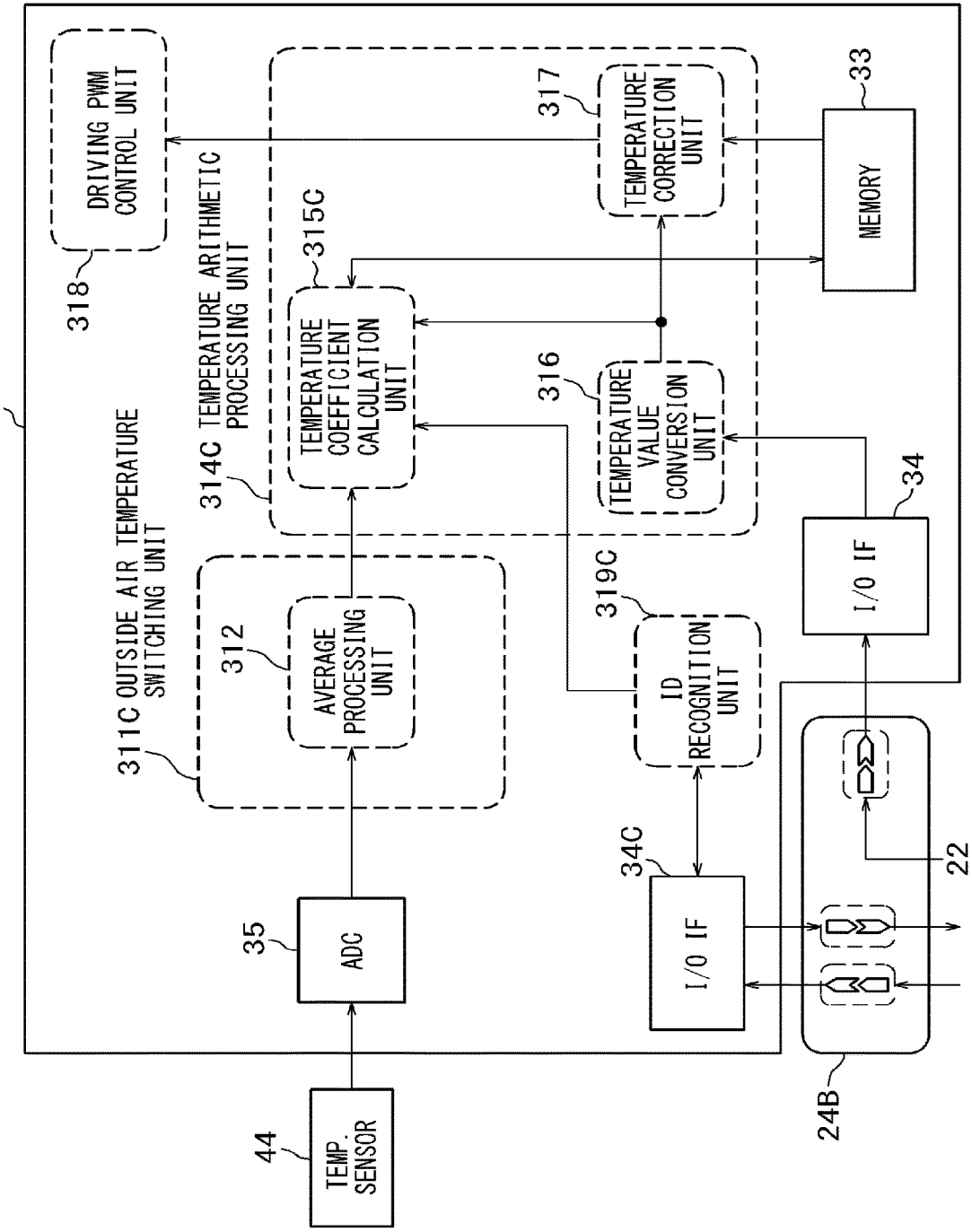
FIG. 15 is a block diagram illustrating one example of a control circuit according to the third practical example.

FIG. 15 is a block diagram illustrating one example of a function of the control circuit according to the third example.

The control circuit 30C according to the third example is the same as the control circuit 30A with the exception that the PC interface 36 is not included, an outside air switching unit 311C does not include the selection unit 313 and an ID recognition unit 319C which reads the temperature characteristic data of the temperature detection diode 12 via an I/O interface 34C is added. Although a broken-line block indicates software processing (the processing that the CPU 31 executes the program), the processing is not limited to the software processing and may be, for example, hardware processing.

A temperature arithmetic processing unit 314C includes a temperature coefficient calculation unit 315C, the temperature value conversion unit 316, the temperature correction unit 317 and so forth. The temperature information which is output from the average processing unit 312, the voltage information of the temperature detection diode 12 obtained by converting the output from the temperature detection A/D converter 22 by the temperature value conversion unit 316 and the temperature coefficient (K) sent from the ID recognition unit 319C are input into the temperature coefficient calculation unit 315C. The temperature coefficient (K), the temperature information (output from the average processing unit 312 and the voltage information (of the temperature detection diode 12 obtained by converting the output from the temperature detection A/D converter 22 by the temperature value conversion unit 316) which have been input into the temperature coefficient calculation unit 315C are stored into the memory 33.

An acquiring method for the temperature characteristic data of the temperature detection diode 12 which is one process of a manufacturing method for the electronics device 1C according to the third example will be described by using FIG. 16.

Figure 16:
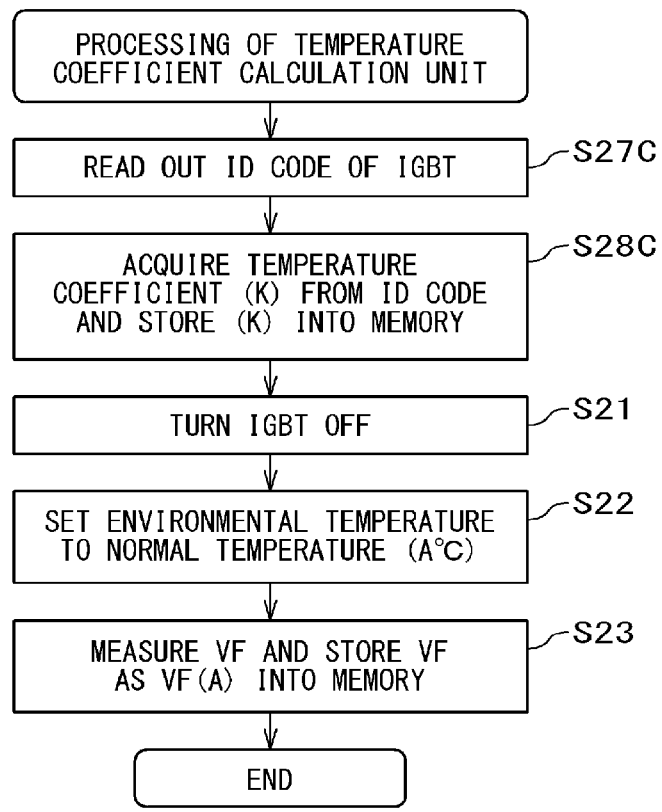
FIG. 16 is a flowchart illustrating one example of processing of a temperature coefficient calculation unit according to the third example of the present disclosure.

FIG. 16 is a flowchart illustrating one example of processing of the temperature coefficient calculation unit according to the third example.

Processing of storing the temperature characteristic data of the temperature detection diode 12 into the electronics device 1C is the same as that in the first example with the exception of provision of step S20. The process corresponding to step S20 will be described.

First, the ID code of the IGBT 10C is read (step S27C). Here, the IC code includes the temperature coefficient (K), a value corresponding to the first value (VF(A)) and a value corresponding to the second value (VF(H)). Then, the temperature coefficient (K) included in the ID code or the temperature coefficient (K) which has been calculated from information included in the ID code is stored into the memory 33 (step S28C). Then, the IGBT 10C is turned off (step S21). Then, the ambient temperature is set to the normal temperature which is the first temperature (A) (step S22). The ambient temperature is input from the outside air temperature detector 44. Then, VF is calculated by the temperature value conversion unit 316 on the bases of the signal which is indicative of the temperature information of the IGBT 10C (the temperature detection diode 12) when the ambient temperature is the first temperature and is output from the temperature detection A/D converter 22 and is stored into the memory 33 as the first value (VF(A)) (step S23).

The operations of the electronics device 1C performed in normal operation are the same as those of the electronics device 1A.

VF is calculated by the temperature value conversion unit 316 on the basis of the signal which is indicative of the temperature information of the IGBT 10C (the temperature detection diode 122) and is output from the temperature detection A/D converter 22 and is set as the third value (VF(N)). The temperature correction unit 317 calculates the measured value (N) of the IGBT 10C by the above-mentioned numerical formula (2) by using the third value (VF(N)), and the temperature coefficient (K), the first temperature (A) and the first value (VF(A)) which are stored in the memory 33.

The driving PWM control unit 318 controls the PWM circuit 32 so as to generate the PWM signal which is the drive signal (DRV) for the switching element 11. In addition, the driving PWM control unit 318 has the function of protecting the IGBT 10C by controlling the PWM circuit 32 so as to suppress driving of the switching element 11 when the temperature has approached the predetermined temperature or by controlling the PWM circuit 32 so as to stop driving of the switching element 11 by deciding that the abnormal state has occurred when the temperature has exceeded the predetermined temperature, in accordance with a result of measurement of the temperature of the IGBT 10C obtained by the temperature arithmetic processing unit 314C.

According to the third example, since ambient temperature changing as performed in the first example and connection with the external PC as performed in the second example are not demanded, it is possible to reduce the adjustment man-hour. In addition, the same advantageous effects as those in the first example are obtained in normal operation.

Application Example

An electric motor system according to one application example of the electronics device according to each of the first to third examples will be described by using FIG. 17.

Figure 17:
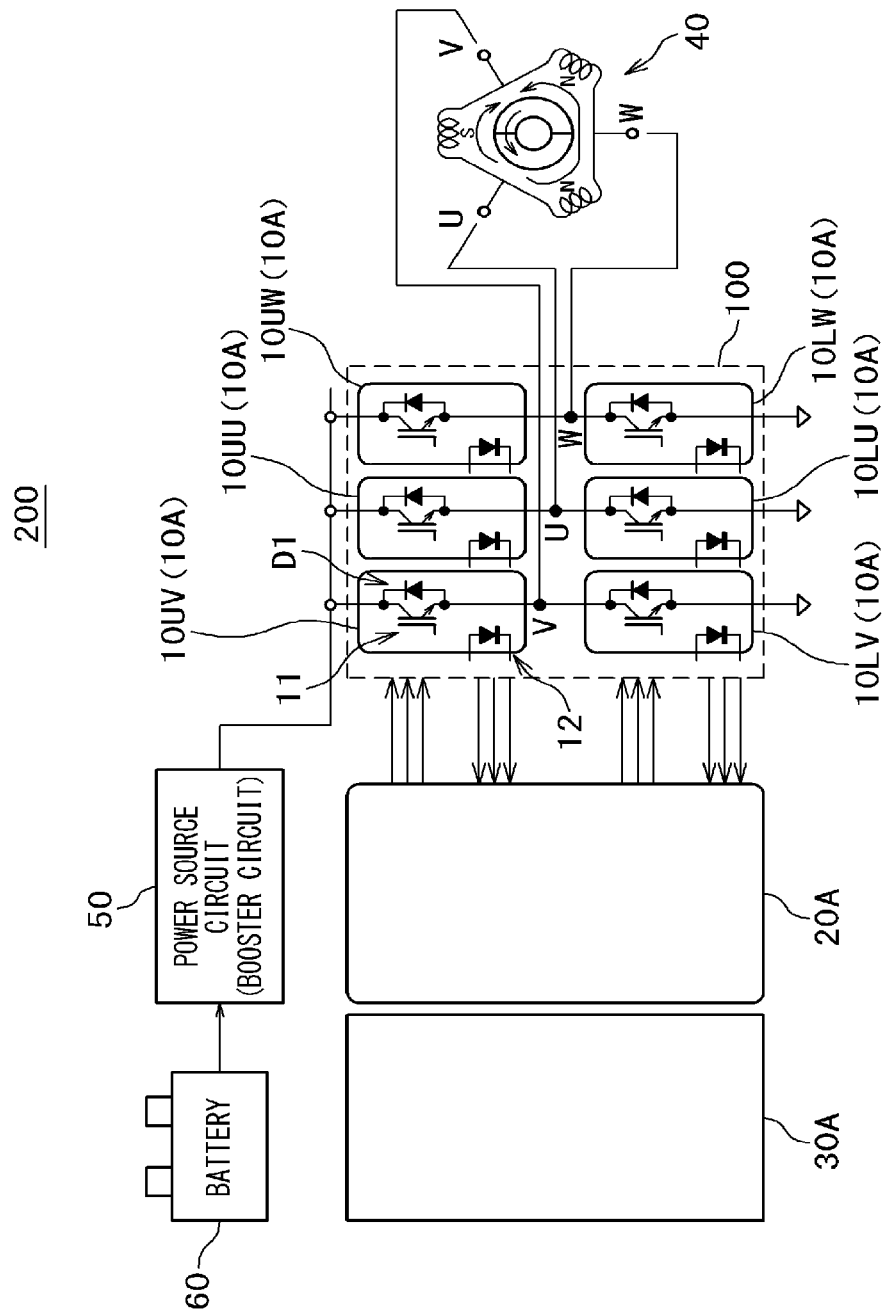
FIG. 17 is a block diagram illustrating one application example of the electronics devices according to the first to third examples of the present disclosure.

As illustrated in FIG. 17, an electric motor system 200 according to one application example includes a three-phase motor 40, a power module 100 configured by using six IGBTs 10A according to the first example, the six driver ICs 20A according to the first example, the control circuit 30A according to the first example, a power source circuit (a booster circuit) 50, a battery 60 and so forth. When driving a vehicle and so forth, the power module 100 performs on-off control on the switching element 11 in the power module 100 such that the current flows into each phase of the three-phase motor 40 by application of a voltage which has been boosted by the power source circuit 50 so as to change the speed of the vehicle and so forth by using a switching frequency in on-off control. Incidentally, when a voltage of the battery 60 is sufficiently high, the booster circuit 50 may not be used. In addition, when braking the vehicle and so forth, on-off control is performed on the switching element 11 in synchronization with a voltage generated in each phase of the three-phase motor 40 so as to perform a so-called rectification operation and to convert the voltage into a DC voltage and thereby the power is regenerated.

In the three-phase motor 40, a rotor is configured by a permanent magnet and an armature is configured by a coil and armature windings for three phases (a U shape, a V phase and a W phase) are arranged at intervals of about 120 degrees. The coils are delta-connected and the current typically flows into the three coils in the U phase, the V phase and the W phase.

The power module 100 includes an IGBT 10UU for power in an upper-arm U phase, an IGBT 10UV for power in an upper-arm V phase, an IGBT 10UW for power in an upper-arm W phase, an IGBT 10LU for power in a lower-arm U phase, an IGBT LV for power in a lower-arm V phase, an IBGT 10LW for power in a lower-arm W phase and so forth. Here, the configurations of the IGBTs 10UU, 10UV, 10UW, 10LU, 10LV and 10LW used in this example are the same as that of the IGBT 10A used in the first example. Each of the IGBTs 10UU, 10UV, 10UW, 10LU, 10LV and 10LW is configured by a semiconductor chip which includes the switching element 11, a reflux diode D1 which is connected in parallel between the emitter and the collector of the switching element 11, the temperature detection diode 12 and so forth. The reflux diode D1 is connected so as to cause the current to flow reversely to the current which flows into the switching element 11. The reflux diode D1 may not be mounted on the semiconductor substrate on which the switching element 11 and the temperature detection diode 12 are formed and in this case it is preferable to encapsulates the reflux diode D1 into the same package as that of the semiconductor substrate on which the switching element 11 and the temperature detection diode 12 are formed.

The IGBT 10B, the driver IC 20B and the control circuit 30B according to the second example may be used and/or the IGBT 10C, the driver IC 20C and the control circuit 30C according to the third example may be used, in place of the IGBT 10A, the driver 20A and the control circuit 30A according to the first example.

Although, in the above-mentioned application example, the example that the electronics device has been applied to the inverter for converting DC current into AC current has been described, the electronics device may be also applied to a power conversion device such as a converter and so forth to be used in the power source circuit (the booster circuit) 50.

The electric motor system 200 is used as the power source of each of the HEV, the EV and so forth. The electronics devices 1A, 1B and IC each is used as an on-vehicle electronics device.

Mounting Example

As described above, the isolators 24 and 24B each is configured by an on-chip transformer. In the following, the on-chip transformer will be described by using FIG. 18.

Figure 18:
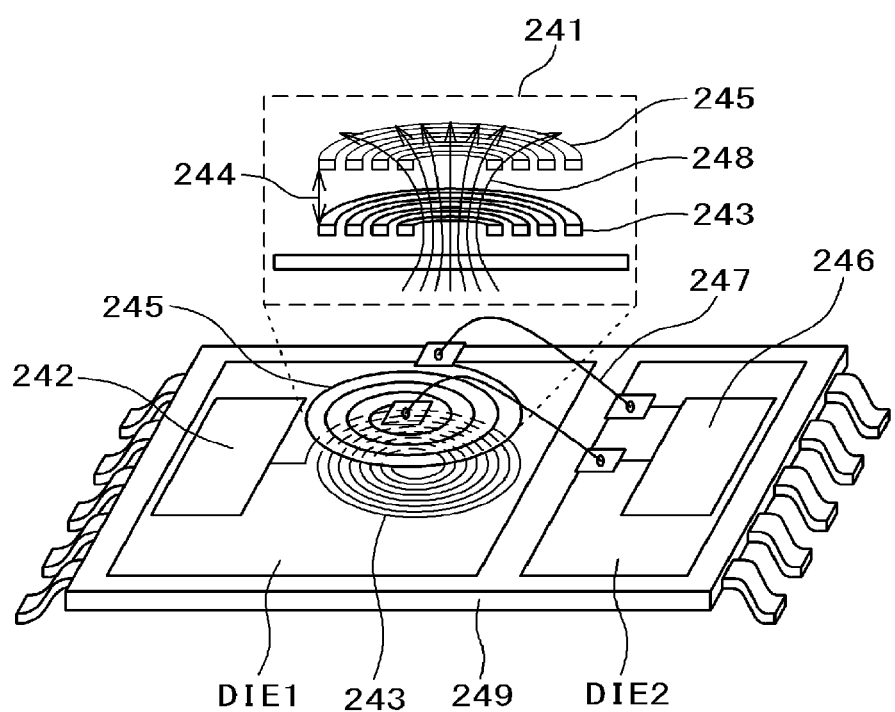
FIG. 18 is a diagram illustrating one example of an isolator used in the electronics devices according to the first to third examples of the present disclosure

FIG. 18 is a diagram illustrating one example of the on-chip transformer which configures the isolator of the electronics device according to each of the first to third examples.

In an on-chip transformer 241, a spiral coil 243 is formed on a chip DIE1 on the side that a transmission pulse generation circuit 242 is provided, a spiral coil 245 is formed above the spiral coil 243 via an interlayer film 244 formed by an insulating film such as a silicon oxide film and so forth and the chip DIE1 is bonded with a chip DIE2 on the side that a received pulse detection circuit 246 is provided by bonding wires 247. In other words, the on-chip transformer 241 performs signal transmission via magnetic coupling 248 with the coil 243 formed on the lower layer being insulated from the coil 245 formed on the upper layer by the interlayer film 244. For example, the chip DIE1 of the driver IC 20A is formed to connect with the control circuit 30A and the gate circuit 21, the temperature detection A/D converter 22 and so forth are forced on the chip DIE2. The chip DIE1 and the chip DIE2 are mounted on one package 249. Also the drivers 1C 20B and 20C may be mounted similarly. By mounting the driver, the control circuit and so forth in this way, it becomes possible to configure the control circuit 30A by one package and to configure the driver IC 20A by six packages in the electric motor system 200. When the isolator is to be configured by a photocoupler, further six package are used for the photocoupler.

Figure 19:
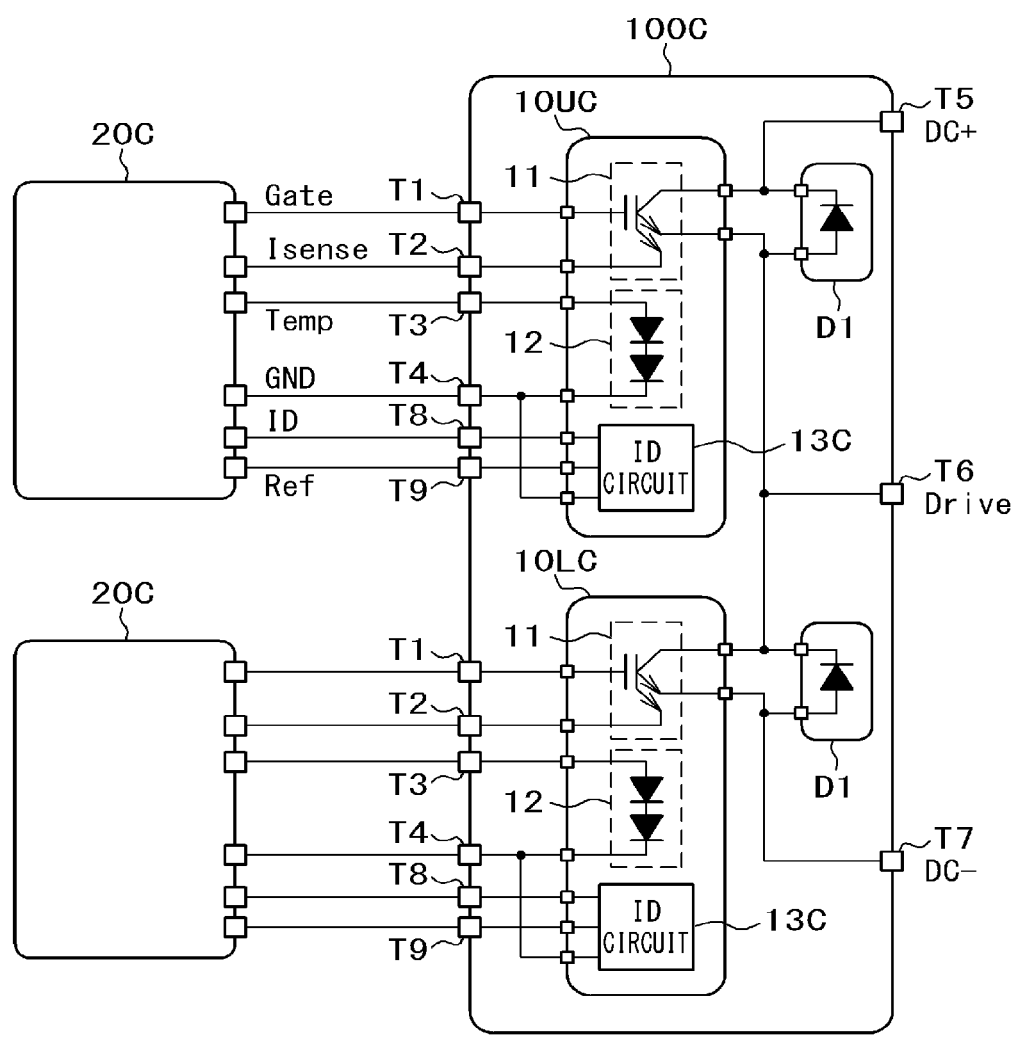
FIG. 19 is a diagram illustrating one example of a configuration of a power module.

One example that a power module 100C using the IGBTs according to the third example and the driver ICs according to the third example have been connected together will be described by using FIG. 19. FIG. 19 is a diagram illustrating one example of a configuration of the power module and part corresponding to one phase of a three-phase control structure is illustrated. The power module 100C includes three sets of the IGBTs 10UC and the reflux diodes D1, three sets of the IGBTs 10LC and the reflux diodes D1 and so forth. The IGBTs 10UC and 10LC each includes the switching element 11, the temperature detection diode 12, the ID circuit 13C and so forth. The IGBTs 10UC and 10LC are the same as the IGBT 10C according to the third example.

The power modules 100C includes, as one set of terminals, a gate terminal T1 for supplying a signal (Gate) to a gate terminal of the switching element 11 of the IGBT 10UC, a sense current terminal T2 for outputting a sense current (Isense) from a sense emitter terminal, a power source terminal T5 for supplying a positive voltage (DC+) to a collector terminal, a drive terminal T6 for outputting a drive current (Drive) from an emitter terminal and so forth. In addition, the power module 100C also includes a temperature detection terminal T3 for outputting a forward voltage (Temp) to the temperature detection diode 12 of the IGBT 10UC, a ground terminal T4 for connecting a grounded voltage source (GND) to a cathode terminal and so forth.

Further, the power module 100C includes, as another set of terminals, the gate terminal T1 for supplying the signal (Gate) to the gate terminal of the switching element 11 of the IGBT 10LC, the sense current terminal T2 for outputting the sense current (Isense) from the sense emitter terminal, a power source terminal T7 for supplying a negative voltage (DC−) to the emitter terminal and so forth. In addition, the power module 100C also includes the temperature detection terminal T3 for outputting the forward voltage (Temp) to the temperature detection diode 12 of the IGBT 10LC, the ground terminal T4 for connecting the grounded voltage source (GND) to the cathode terminal and so forth. Incidentally, the collector terminal of the IGBT 10LC is connected to the drive terminal T6.

The ID circuit 13C is configured by the laddered resistor and includes a terminal for measuring a reference resistance value (Ref), a terminal for measuring a resistance value (ID) of the laddered register which is obtained by cutting the electrical fuse (e-Fuse), a terminal adapted to connect the ID circuit 13C to GND and so forth. These terminals are respectively connected to their corresponding terminals, that is, a reference resistance value measurement terminal T9, a resistance value measurement terminal T8 and the ground terminal T4. The gate terminal T1, the sense current terminal T2, the temperature detection terminal T3, the ground terminal T4, the reference resistance value measurement terminal T9 and the resistance value measurement terminal T8 are connected to the driver IC 20C.

A GND terminal is commonly used between the ID circuit 13C and the temperature detection diode 12 due to addition of the ID circuit 13C. Consequently, two terminals and two pieces of connection wiring are additionally installed for every driver IC and twelve terminals and twelve pieces of connection wiring are additionally installed as a whole. Incidentally, also when the IGBT 10B (the ID circuit 13B) according to the second example has been used, two terminals and two pieces of connection wiring are additionally installed for every driver IC and twelve terminals and twelve pieces of connection wiring are additionally installed as a whole similarly.

Fourth Example

The fourth example of the present disclosure is one example that the ID information (the temperature characteristic data) of the IGBT concerned is obtained with no intervention of the driver IC. One example of a configuration of an electronics device 1D according to the fourth example will be described by using FIG. 20.

Figure 20:
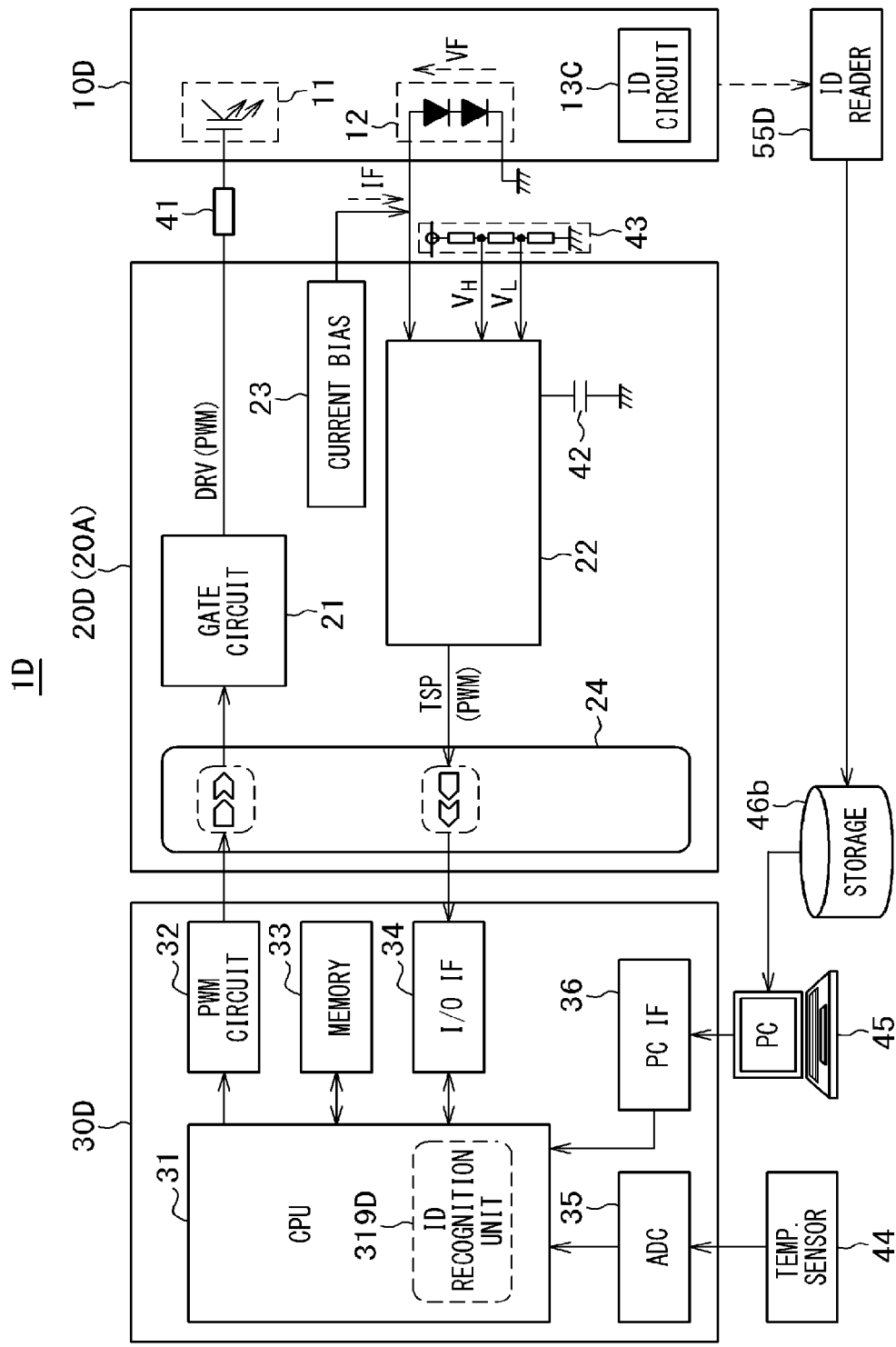
FIG. 20 is a block diagram illustrating one example of an electronics device according to a fourth example of the present disclosure.

FIG. 20 is a block diagram illustrating one of the configuration of the electronics device according to the fourth example.

The electronics device 1D according to the fourth example includes an IGBT 10D which is the power semiconductor device, a driver IC 20D which is the first semiconductor integrated circuit device, a control circuit 30D which is the second semiconductor integrated circuit device and so forth. Although the IGBT 10D is the same as the IGBT 10C, the ID circuit 13C is not connected to the driver IC 20D. The driver IC 20D is the same as the driver IC 20. The control circuit 30D includes a PC interface 36 and an ID recognition unit 319D in place of the I/O interface 34C and the ID recognition unit 319C of the control circuit 30C. Other configurations of the control circuit 30D are the same as those of the control circuit 30C. The ID recognition unit 319D acquires the temperature characteristic data on the basis of an ID measurement data library which is obtained from an external storage 46b.

Temperature characteristic data writing into the ID circuit 13C will be described.

In a wafer testing process performed when manufacturing the wafer for the IGBT 10D, tests are performed at the normal temperature and the high-temperature by using a not illustrated tester (a prober). The tester calculates the temperature coefficient (K) from the temperature characteristic data (the first value (VF(A)), the second value (VF(H)), the first temperature (A) and the second temperature (H)) of the temperature detection diode 12 of the IGBT 10D which has been obtained in the tests and records the calculated temperature coefficient (K) into an external storage (a storage corresponding to an external storage 46a in a fifth example) as the wafer measurement data library. A not illustrated ID write device reads the temperature coefficient (K) out of the wafer measurement data library recorded in the external storage and sets the temperature coefficient (K) by cutting the electrical fuse of the ID circuit 13 and so forth. Incidentally, the first value (VF(A)) and the second value (VF(H)) may be set by cutting the electrical fuse and so forth in place of the temperature coefficient (K). In this case, it is preferable to set the data on difference between the typical value and the first value (VF(A)) of VF at the normal temperature, the data on difference between the typical value and the second value (VF(H)) of VF at the high-temperature and the reference data.

Figure 21:
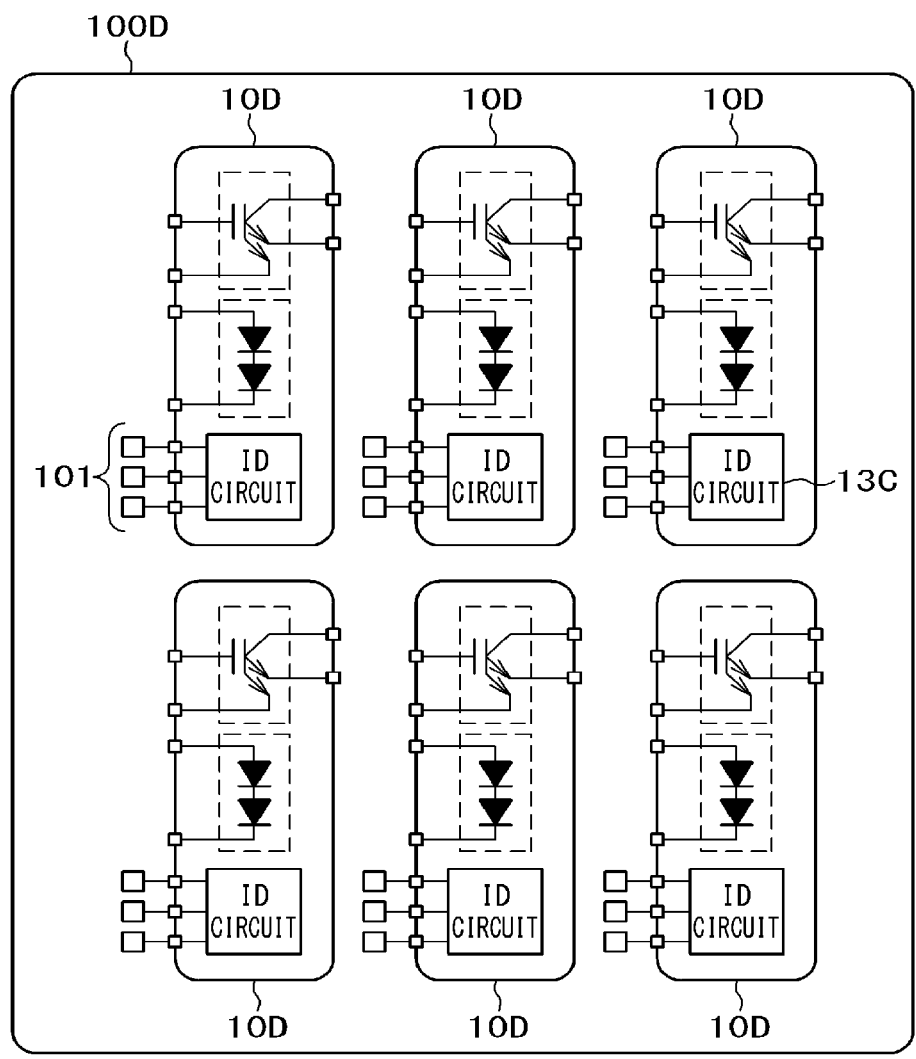
FIG. 21 is a diagram illustrating one example of a configuration of a power module according to the fourth example of the present disclosure.
Figure 22:
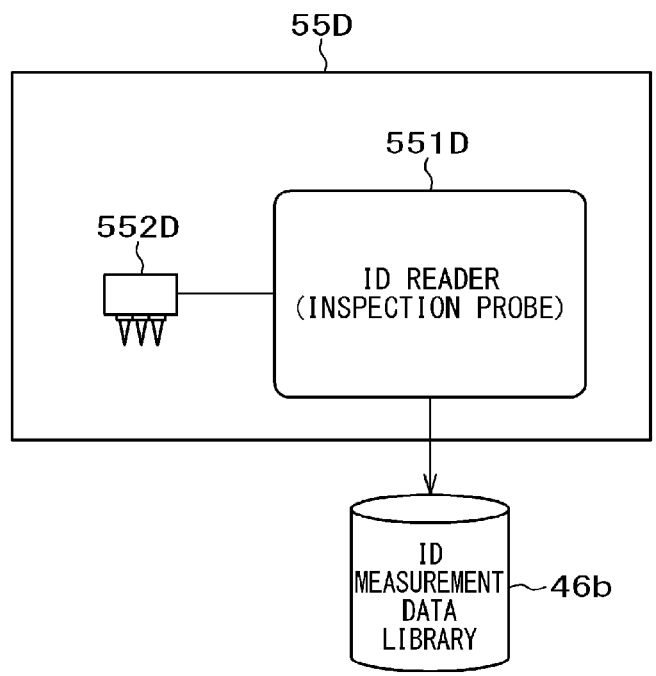
FIG. 22 is a diagram illustrating one example of an ID read device according to the fourth example of the present disclosure.
Figure 23:
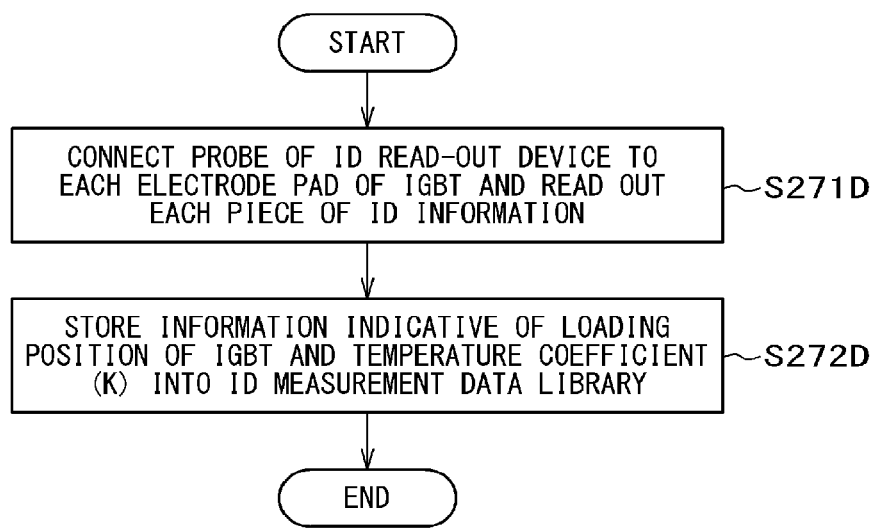
FIG. 23 is a flowchart illustrating one example of reading of temperature characteristic data out of an ID circuit according to the fourth example of the present disclosure.

Next, temperature characteristic data reacting out of the ID circuit 13C will be described by using FIG. 21 to FIG. 23. FIG. 21 is a diagram illustrating one example of a power module according to the fourth example. FIG. 22 is a diagram illustrating one example of an ID read device according to the fourth example. FIG. 23 is a flowchart illustrating one example of temperature characteristic data reading out of the ID circuit according to the fourth example.

An ID read device (ID READER) 55D includes a probe 552D used for connection to an electrode pad 101 to be connected to the ID circuit 13C of a power module 100D, an ID reader (ID READER) 551D which detects the temperature characteristic data on the basis of a signal from the probe 552D and so forth. The electrode pad 101 includes electrode pads respectively corresponding to the reference resistance value measurement terminal T9, the resistance value measurement terminal T8 and the ground terminal T4. In an assembling process for the power module 100D, after the IGBT 10D has been loaded on the substrate of the power module 100D and before the IGBT 10D is encapsulated, the ID read device 55D connects the probe 552D to the electrode pad 101 of the IGBT 10D and reads the temperature characteristic data out of the ID circuit 13C (step S271D). Then, the ID read device 55D records information indicative of the loading position of the IGBT 10D on the power modules 100D and the temperature characteristic data into the external storage 46b as the ID measurement data library (step S272D). Incidentally, step 272D may not necessarily be the step of the assembling process for the power module 100D.

The control circuit 30D according to the fourth example is the same as the control circuit 30C with the exception that the control circuit 30D includes the ID recognition unit 319D which reads the temperature characteristic data of the temperature detection diode 12 via the PC interface 36 in place of the ID recognition unit 319C which reads the temperature characteristic data of the temperature detection diode 12 via the I/O interface 34C and includes the outside air temperature switching unit 311 in place of the outside air temperature switching unit 311C.

An acquiring method for the temperature characteristic data of the temperature detection diode 12 which is one process of a manufacturing method for the electronics device 1D according to the fourth example will be described by using FIG. 24.

Figure 24:
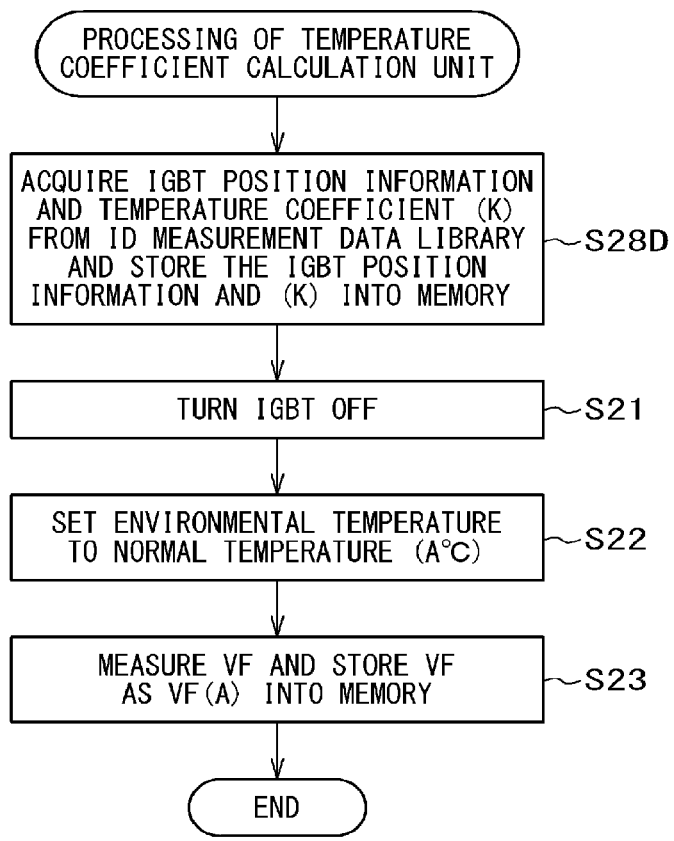
FIG. 24 is a flowchart illustrating one example of processing of a temperature coefficient calculation unit according to the fourth example of the present disclosure.

FIG. 24 is a flowchart illustrating one example of processing of the temperature coefficient calculation unit according to the fourth example. The process of storing the temperature characteristic data of the temperature detection diode 12 into the electronics device 1D is the same as that in the third example with the exception of provision of step S27C and step S28C. The step corresponding to step S27C is performed in the assembling process for the power module 100D as mentioned above. In the following, the process corresponding to step 28C will be described.

The ID recognition unit 319D acquires the position information of the IGBT 10C on the power module 100D and the temperature characteristic data of the temperature detection diode 12 from the ID measurement data library recorded in the external storage 46b via the PC interface 36. Here, the temperature characteristic data includes the temperature coefficient (K), the value corresponding to the first value (VF(A)), the value corresponding to the second value (VF(H)) and so forth. Then, the temperature coefficient (K) included in the temperature characteristic data or the temperature coefficient (K) which has been calculated from the information included in the temperature characteristic data is stored into the memory 33 (step S28D).

The operations of the electronics device 1D performed in normal operation are the same as those of the electronics device 1C. Incidentally, similarly to the third example, in normal operation of the electronics device 1D, the outside air temperature detector 44, the PC 45, the external storage 46b and the ID read device 55D are not used.

According to the fourth example, since it is not demanded to connect the ID circuit 13C with the driver IC 20D as in the third example, it is possible to reduce the number of terminals to be installed and the number of pieces of connection wiring to be installed.

Fifth Example

The fifth example of the present disclosure is an example that the ID information (the ID code peculiar to the chip concerned) of the IGBT is obtained with no intervention of the driver IC. One example of a configuration of an electronics device 1E according to the fifth example will be described by using FIG. 25.

Figure 25:
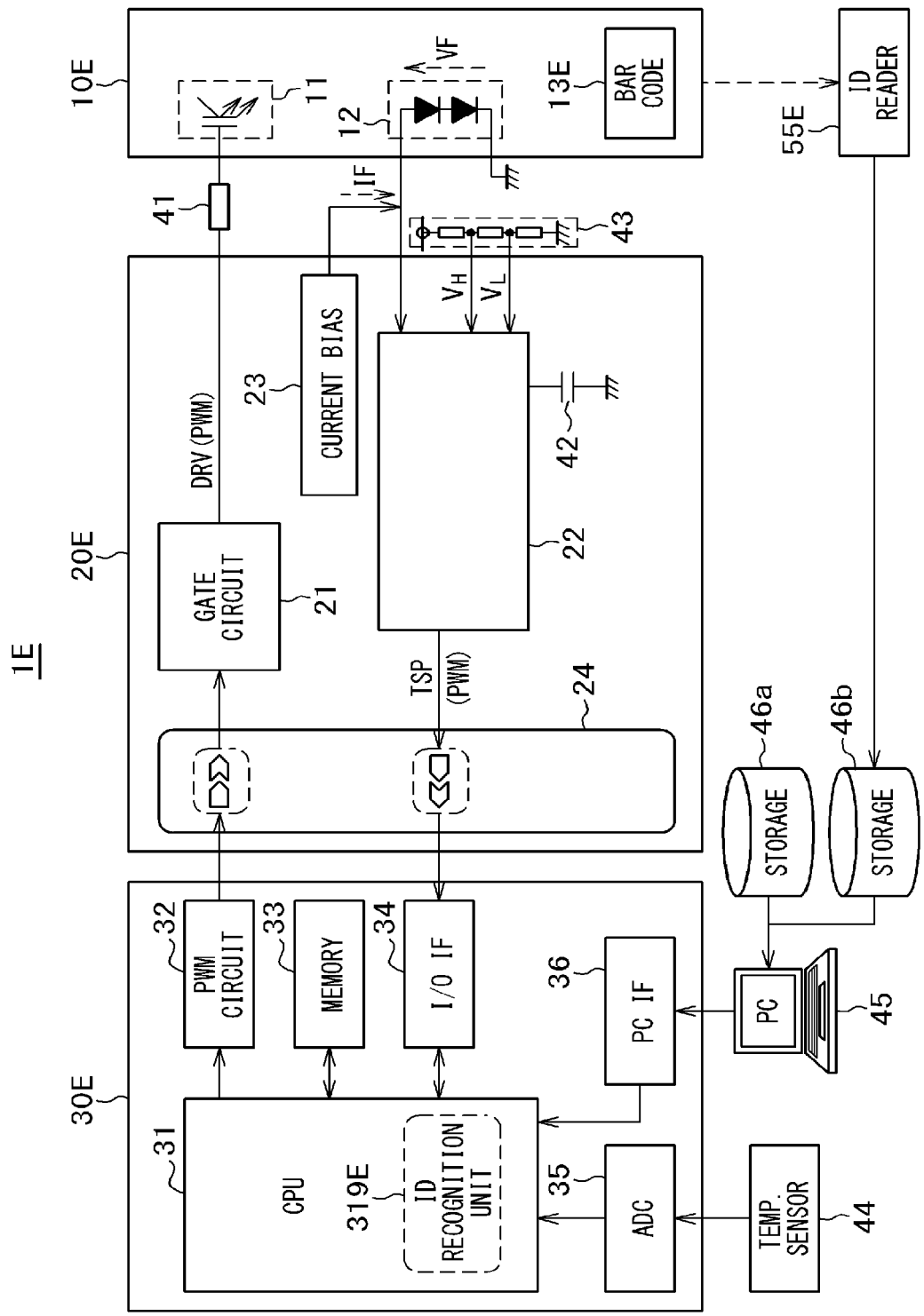
FIG. 25 is a block diagram illustrating one example of an electronics device according to a fifth example of the present disclosure.

FIG. 25 is a block diagram illustrating one example of the configuration of the electronics device according to the fifth example.

The electronics device 1E according to the fifth example includes an IGBT 10E which is the power semiconductor device, a driver IC 20E which is the first semiconductor integrated circuit device, a control circuit 30E which is the second semiconductor integrated circuit device and so forth. Although the IGBT 10E is the same as the IGBT 10A, a bar code 13E for recording the ID code is affixed to the IGBT 10E. The driver IC 20E is the same as the driver IC 20. The control circuit 30E includes an ID recognition unit 319E in place of the ID recognition unit 319B of the control circuit 30B and does not include the I/O interface 34B. Other configurations of the control circuit 30E are the same as those of the control circuit 30B. The ID recognition unit 319E acquires the temperature characteristic data on the basis of the wafer measurement data library which is supplied from the external storage 46a and the ID measurement data library which is supplied from the external storage 46b.

ID code writing into the bar code 13E will be described.

In a wafer testing process performed when manufacturing the wafer for the IGBT 10E, tests are performed at the normal temperature and the high-temperature by using a not illustrated tester (a prober). The temperature characteristic data (VF(A), VF(H) and K) of the IGBT 10E obtained in the tests is stored into the external storage 46a as the wafer measurement data library together with the ID code. Incidentally, when performing the wafer testing process, the bar code 13E is formed on the IGBT 10E or a seal is affixed to the IGBT 10E and then the ID code is set on the bar code 13E or the seal.

Figure 26:
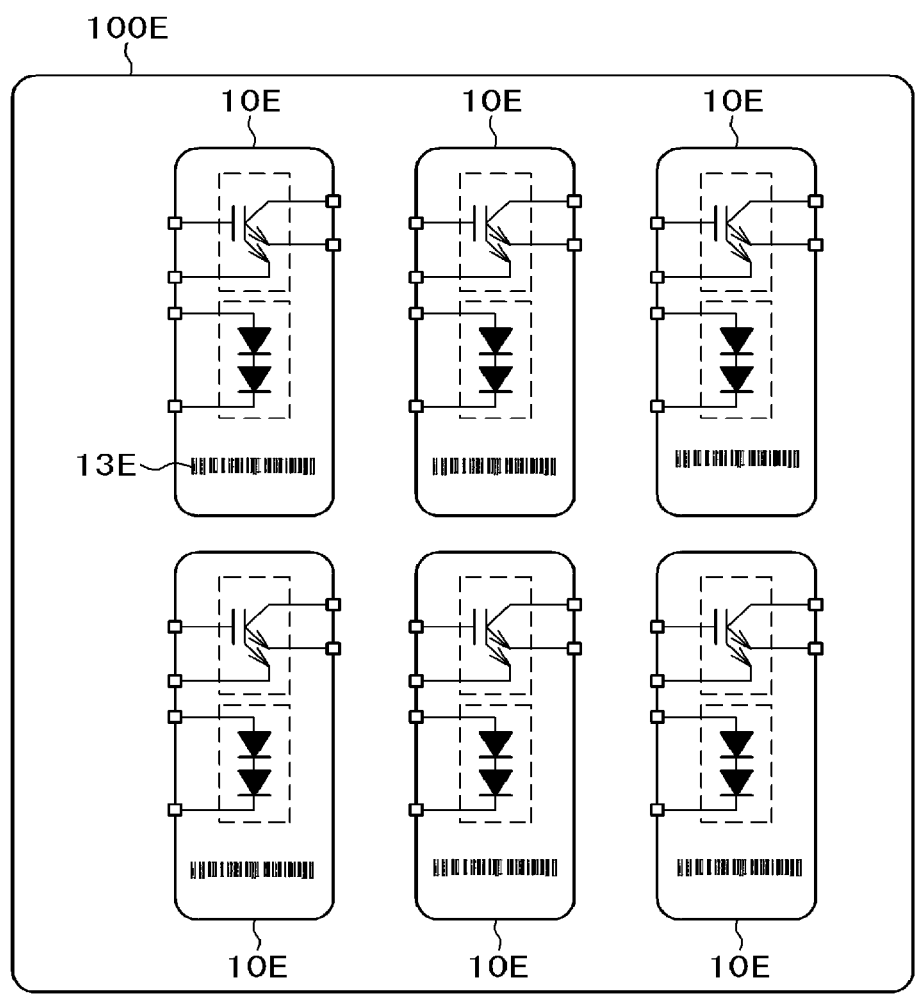
FIG. 26 is a diagram illustrating one example of a configuration of a power module according to the fifth example of the present disclosure.
Figure 27:
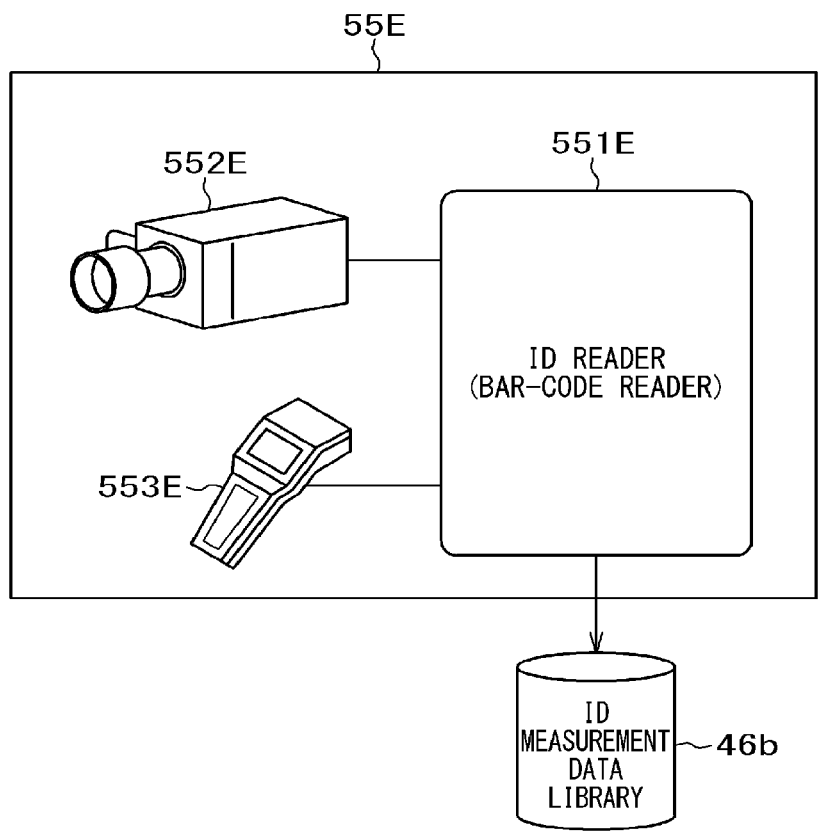
FIG. 27 is a diagram illustrating one example of an ID read device according to the fifth example of the present disclosure.
Figure 28:
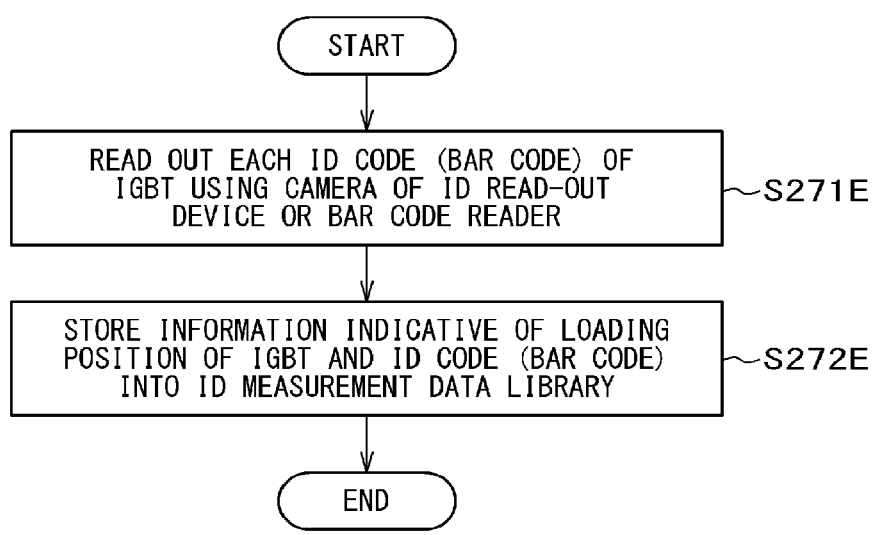
FIG. 28 is a flowchart illustrating one example of ID code reading according to the fifth example of the present disclosure.

Next, ID code reading out of the bar code 13E will be described by using FIG. 26 to FIG. 28. FIG. 26 is a diagram illustrating one example of a configuration of a power module according to the fifth example. FIG. 27 is a diagram illustrating one example of an ID read device according to the fifth example. FIG. 28 is a flowchart illustrating one example of ID code reading according to the fifth example. An ID read device (ID READ DEVICE) 55E includes a camera 552E or a bar code reader 553E adapted to read the bar code 13E of an IGBT 10E, an ID reader (BAR-CODE READER) 551E which detects the ID code on the basis of a signal from the camera 552E or the bar code reader 553E and so forth. In an assembling process for a power module 100E, the ID read device 55E reads the ID code out of the bar code 13E by using the camera 552E or the bar code reader 553E (step S271E) and records the information indicative of the loading position of the IGBT 10E on the power module 100E and the ID code into the external storage 46b as the ID measurement data library (step S272E).

The control circuit 30E according to the fifth example is the same as the control circuit 30B with the exception that the control circuit 30E includes the ID recognition unit 319E which reads the temperature characteristic data of the temperature detection diode 12 via the PC interface 36 in place of the ID recognition unit 319B which reads the temperature characteristic data of the temperature detection diode 12 via the I/O interface 34B.

An acquiring method for the temperature characteristic data of the temperature detection diode 12 which is one process of a manufacturing method for the electronics device 1E according to the fifth example will be described by using FIG. 29.

Figure 29:
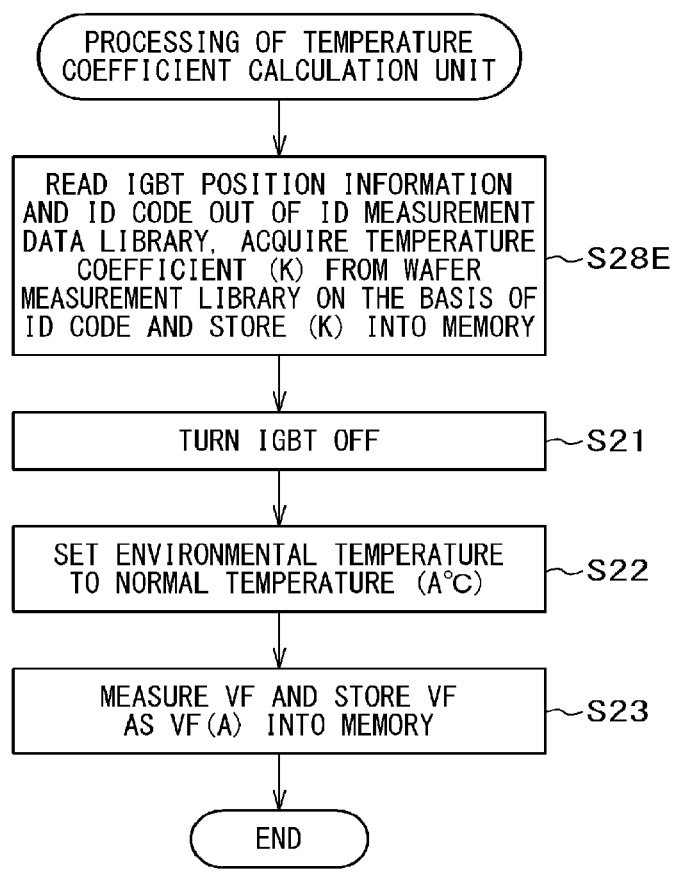
FIG. 29 is a diagram illustrating one example of processing of a temperature coefficient calculation unit according to the fifth example of the present disclosure.

FIG. 29 is a flowchart illustrating one example of processing of a temperature coefficient calculation unit according to the fifth example 5.

A process of storing the temperature characteristic data of the temperature detection diode 12 into the electronics device 1E is the same as that in the second example with the exception of provision of step S27 and step S28. The step corresponding to step S27 is performed in the assembling process for the power module 100E as described above. In the following, a process corresponding to step S28 will be described.

The ID recognition unit 319E acquires the information on loading position of the IGBT 10E on the power module 100E and the ID code of the IGBT 10E from the ID measurement data library recorded in the external storage 46b via the PC interface 36. The ID recognition unit 319E acquires the temperature characteristic data of the IGBT 10E from the wafer measurement data library which is recorded in the external storage 46a on the basis of the ID code. Here, the temperature coefficient (K), the value corresponding to the first value (VF(A)) and the value corresponding to the second value (VF(H)) are included in the temperature characteristic data. Then, the temperature coefficient (K) included in the temperature characteristic data or the temperature coefficient (K) which has been calculated from the information included in the temperature characteristic data is stored into the memory 33 (step S28E).

The operations of the electronics device 1E performed in normal operation are the same as those of the electronics device 1B. Incidentally, similarly to the second example, in normal operation of the electronics device 1E, the outside air temperature detector 44, the PC 45, the external storage 46a and 46b and the ID read device 55E are not used.

According to the fifth example, since it is not demanded to connect the ID circuit 13B with the driver IC 20E as in the second example, it is possible to reduce the number of terminals to be installed and the number of pieces of connection wiring to be installed. In addition, since it is not demanded to install the ID circuit on the IGBT 10E as in the fourth example, manufacture of the IGBT is facilitated and it is also possible to reduce the cost involved.

Sixth Example

The sixth example of the present disclosure is another example that the ID information (the ID code peculiar to the chip concerned) of the IGBT is obtained with no intervention of the driver IC. A configuration of an electronics device 1F according to the sixth example will be described by using FIG. 30.

Figure 30:
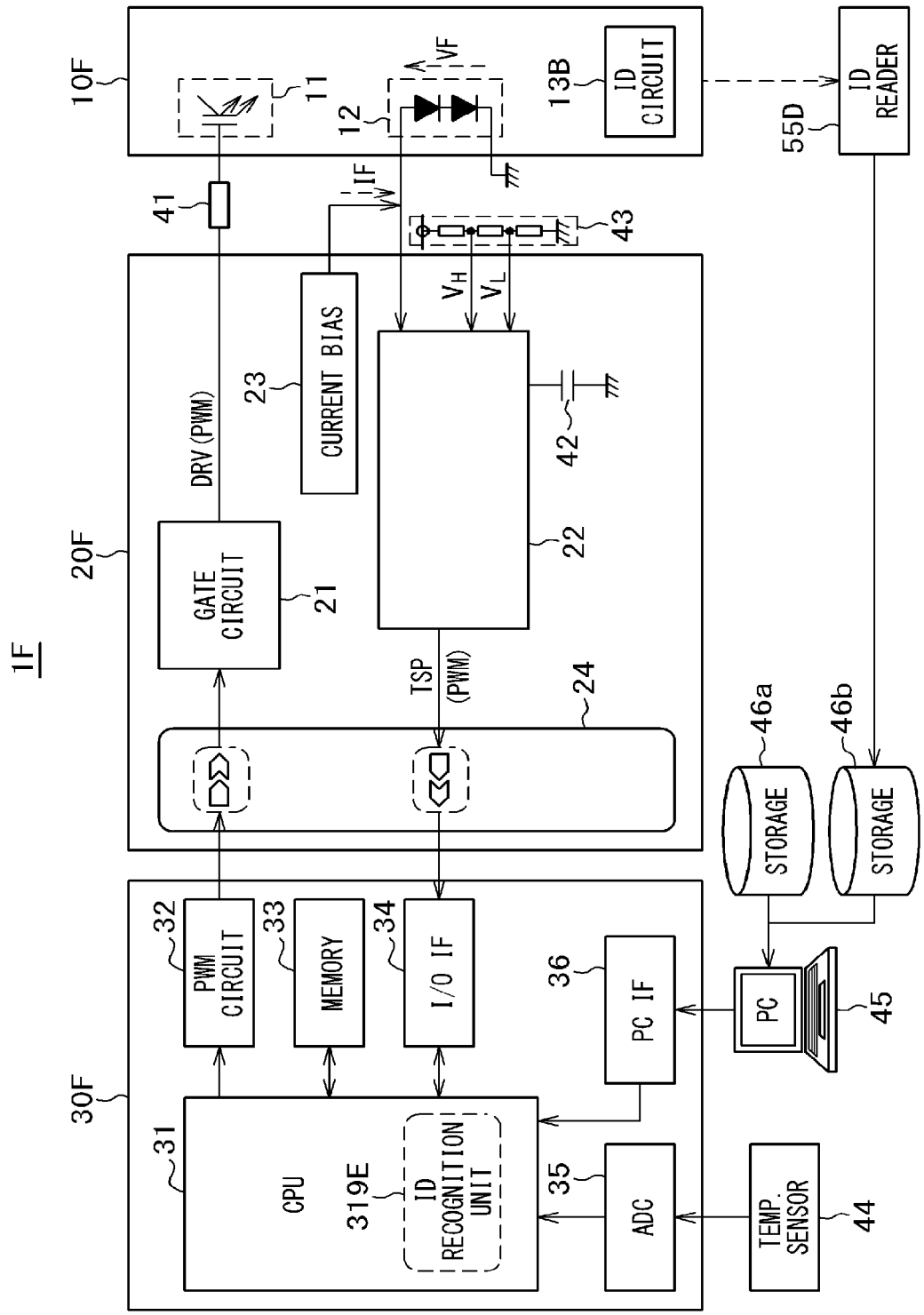
FIG. 30 is a block diagram illustrating one example of an electronics device according to a sixth example of the present disclosure.

FIG. 30 is a diagram illustrating one example of the configuration of the electronics device according to the sixth example.

The electronics device 1F according to the sixth example includes an IGBT 10F which is the power semiconductor device, a driver IC 20F which is the first semiconductor integrated circuit device, a control circuit 30F which is the second semiconductor integrated circuit device and so forth. Although the IGBT 10F is the same as the IGBT 10B, the ID circuit 13B is not connected to the driver IC 20F. The driver IC 20F is the same as the driver ICs 20 and 20E. The control circuit 30F is the same as the control circuit 30E. The ID recognition unit 319E acquires the temperature characteristic data on the basis of the wafer measurement data library which is supplied from the external storage 46a and the ID measurement data library which is supplied from the external storage 46b.

ID code writing into the ID circuit 13B will be described. In a wafer testing process performed when manufacturing the wafer for the IGBT 10F, tests are performed at the normal temperature and the high-temperature by using a not illustrated tester (a prober). The temperature characteristic date (VF(A), VF(H) and K) of the IGBT 10F which has been obtained in the tests is stored into the external storage 46a as the wafer measurement data library together with the ID code. Incidentally, in the wafer testing process, the ID code is set by cutting the electrical fuse of the ID circuit 13B of the IGBT 10F and so forth.

Figure 31:
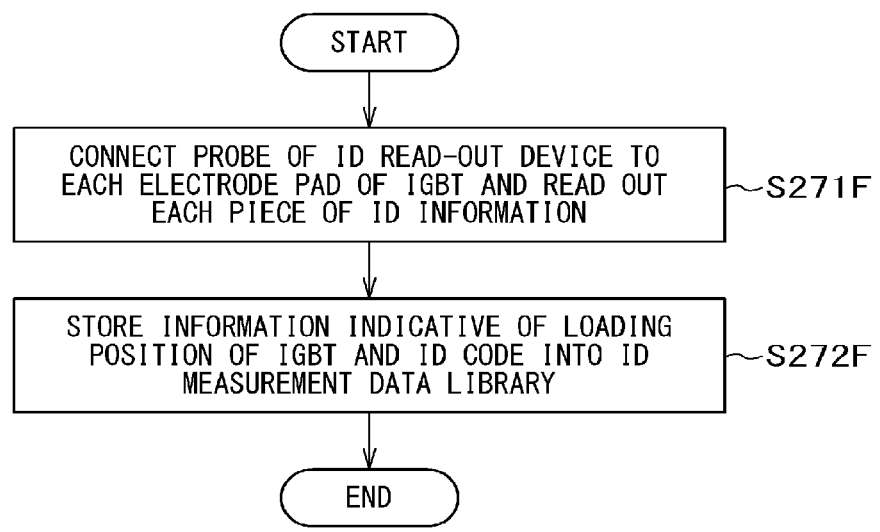
FIG. 31 is a flowchart illustrating one example of ID code reading according to the sixth example of the present disclosure.

Next, ID code reading out of the ID circuit 13B will be described by using FIG. 31. FIG. 31 is a flowchart illustrating one example of ID code reading according to the sixth example. In an assembling process for a power module 100F, the ID read device 55D connects the probe 552D to the terminal and reads the ID code out of the ID circuit 13B (step S271F) and records the information indicative of the loading position of the IGBT 10F on the power module 100F and the ID code into the external storage 46b as the ID measurement data library (step S272F).

An acquiring method for the temperature characteristic data of the temperature detection diode 12 which is one process of a manufacturing method for the electronics device 1F according to the sixth example is the same as that of the fifth example.

The operations of the electronics device 1F performed in normal operation are the same as those of the electronics device 1B. Incidentally, similarly to the second example, in normal operation of the electronics device 1F, the outside air temperature detector 44, the PC 45, the external storages 46a and 46b and the ID read device 55D are not used.

According to the sixth example, since it is not demanded to connect the IC circuit 13B with the driver IC 20F as in the second example, it is possible to reduce the number of terminals to be installed and the number of pieces of connection wiring to be installed.

Seventh Example

The seventh example of the present disclosure is an example that an existing terminal is commonly used between an IGBT 10G and the ID circuit 13B so as to obtain the ID information (the ID code peculiar to the chip concerned). A configuration of an electronics device 1G according to the seventh example will be described by using FIG. 32.

Figure 32:
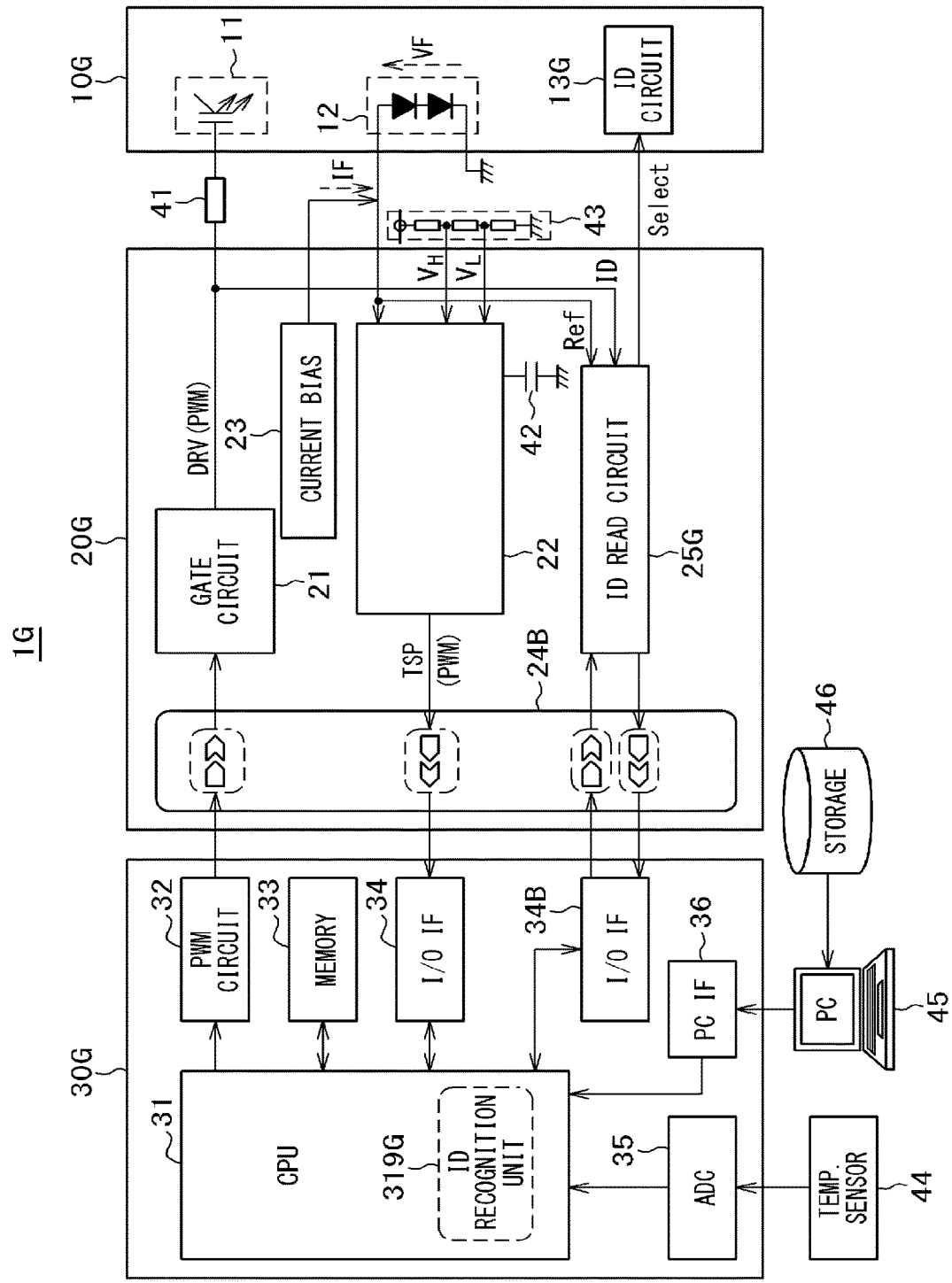
FIG. 32 is a block diagram illustrating one example of an electronics device according to a seventh example of the present disclosure.

FIG. 32 is a block diagram illustrating one example of the configuration of the electronics device according to the seventh example.

The electronics device 1G according to the seventh example includes the IGBT 10G which is the power semiconductor device, a driver IC 20G which is the first semiconductor integrated circuit device, a control circuit 30G which is the second semiconductor integrated circuit and so forth.

Figure 33:
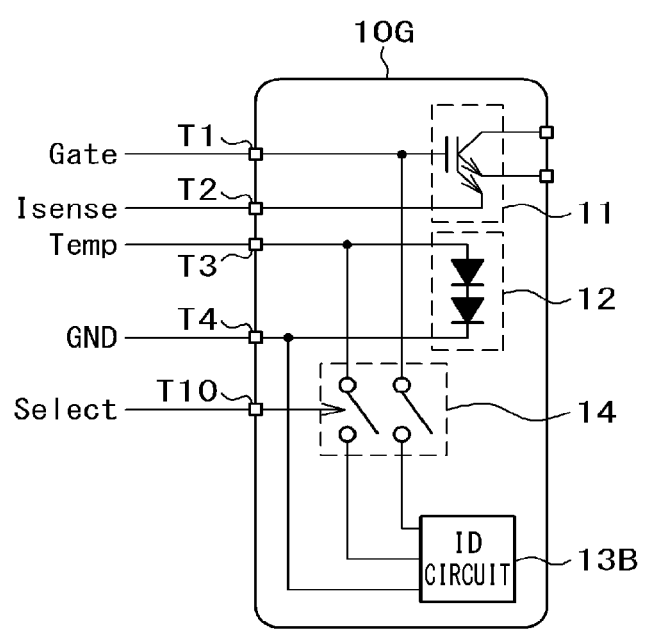
FIG. 33 is a diagram illustrating one example of a configuration of an IGBT according to the seventh example of the present disclosure.

FIG. 33 is a diagram illustrating one example of the configuration of the IGBT according to the seventh example. The IGBT 10G is configured by adding the switching circuit 14 to the IGBT 10B. In the IGBT 10G, the gate terminal is also used as a terminal for measuring the resistance value of the ID circuit 13B and the sense current terminal T2 is also used as a terminal for measuring the reference resistance value (Ref) of the ID circuit 13B. The switching circuit 14 is controlled with a signal (Select) which is input from a terminal T10.

The driver IC 20G is the same as the driver IC 20B with the exception of provision of an ID read circuit 25G. The TD read circuit 25G is the a same as the ID read circuit 25B with the exception that a signal for controlling the switching circuit 14 is output and a signal from the ID circuit 13B is input through a signal line through which the drive signal (DRV) is output and a signal line through which the bias current flows.

The control circuit 30G includes an IC recognition unit 319G in place of the ID recognition unit 319 of the control circuit 30B and is the same as the control circuit 30B in other configurations. The ID recognition unit 319G recognizes the ID code on the basis of a signal from the ID read circuit 25G.

In a wafer testing process performed when manufacturing the wafer for the IGBT 10G, tests are performed at the normal temperature and the high-temperature by using a not illustrated tester (a prober). The temperature characteristic data (VF(A), VF(H) and K) of the IGBT 10G which has been obtained in the tests is stored into the external storage 46 together with the ID code as the wafer measurement data library. Incidentally, in the wafer testing process, the ICD code is set by cutting the electrical fuse of the ID circuit 13B of the IGBT 10G and so forth.

An acquiring method for the temperature characteristic data of the temperature detection diode 12 which is one process of a manufacturing method for the electronics device 1G according to the seventh example will be described by using FIG. 34.

Figure 34:
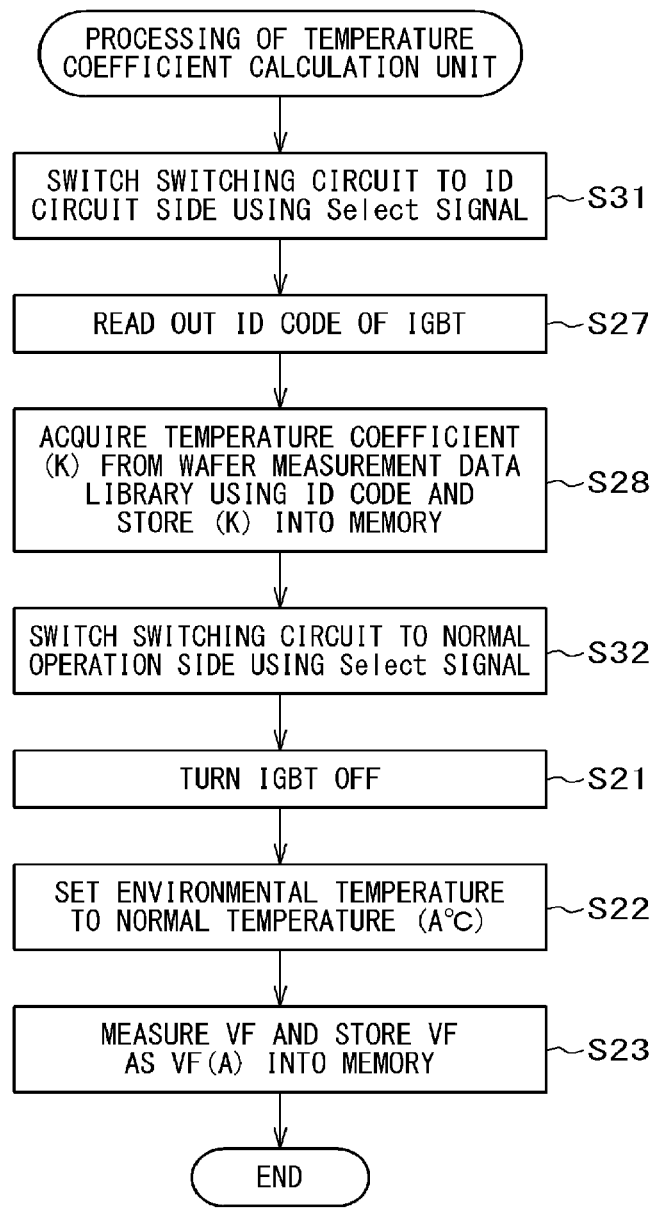
FIG. 34 is a flowchart illustrating one example of processing of a temperature coefficient calculation unit according to the seventh example of the present disclosure.

FIG. 34 is a flowchart illustrating one example of processing of a temperature coefficient calculation unit according to the seventh example.

The manufacturing method for the electronics device 1G is the same as that in the second example with the exception that new processes are added before step S27 and after step S28. In the following, step S27 and step S28, and steps to be executed before step S27 and after step S28 will be described.

First, the ID recognition unit 319G inputs the signal (Select) with which the switching circuit 14 connects an output of the ID circuit 13B to the gate terminal T1 and the temperature detection terminal T3 into the terminal T10 (stop S31). The ID recognition unit 319G reads the ID code of the IGBT 10G (step S27). Then, the ID recognition unit 319G acquires the temperature coefficient (K) from the external storage 46 in which the wafer measurement data library is stored using the ID code and stores the temperature coefficient (K) so acquired into the memory 33 (step S28). Then, the ID recognition unit 319G inputs the signal (Select)

with which the switching circuit 14 disconnects the output of the ID circuit 13B from the gate terminal T1 and the temperature detection terminal T3 into the terminal T10 (step S31).

The operations of the electronics device 1G performed in normal operation are the same as those of the electronics device 1B. Incidentally, similarly to the second example, in normal operation of the electronics device 1G, the outside air temperature detector 44, the PC 45 and the external storage 46 are not used.

According to the seventh example, since the switching circuit uses the terminal for ID reading also as the terminal to be used in normal operation, it is possible to reduce the number of terminals to be installed and the number of pieces of connection wiring to be installed. Although the switching circuit is controlled with the signal (Select) from the CPU, since acquisition of the ID information is executed only when the IGBT is mounted on the board and a system integration test is at an early stage, inputting of the signal (Select) may be performed by pin setting on the board. The ID circuit 13C which stores the temperature characteristic data of the IGBT concerned may be used in place of the ID circuit 13B which stores the ID code peculiar to the IGBT concerned.

Eighth Example

The eighth example of the present disclosure is an example that the ID information (the ID code peculiar to the chip concerned) is obtained via a serial interface. One example of a configuration of an electronics device 1H according to the eighth embodiment will be described by using FIG. 35.

FIG. 35 is a diagram illustrating one example of the configuration of the electronics device according to the eighth embodiment.

The electronics device 1H according to the eighth embodiment includes an IGBT 10H which is the power semiconductor device, a driver IC 20H which is the first semiconductor integrated circuit device, a control circuit 30H which is the second semiconductor integrated circuit device and so forth.

The IGBT 10H includes an ID circuit 13H which has an interface function of storing the ID code into a digital circuit and sending the ID code via serial communication in place of the ID circuit 13B of the IGBT 10B. Other configurations of the IGBT 10H are the same as those of the IGBT 10B.

The driver IC 20H is the same as the driver IC 20B with the exception of provision of an ID read circuit 25H. The ID read circuit 25H is not of the type of converting the analog ID code into the digital serial signal like the ID read circuit 25B and has a function of receiving a digital ID code from the ID circuit 13H via serial communication and delivering the ID code so received to the control circuit 30H.

The control circuit 30H includes an ID recognition unit 319H in place of the ID recognition unit 319 of the control circuit 30B and includes an I/O interface 34H in place of the I/O interface 34B. Other configurations of the control circuit 30H are the same as those of the control circuit 30B. The ID recognition unit 319H recognizes the ID code on the basis of a signal from the ID read circuit 25H.

In a wafer testing process performed when manufacturing the wafer for the IGBT 10H, tests are performed at the normal temperature and the high-temperature by using a not illustrated tester (a prober). The temperature characteristic data (VF(A), VF(H) and K) of the IGBT 10H which has been obtained in the tests is stored into the external storage 46 together with the ID code as the wafer measurement data library. Incidentally, in the wafer testing process, the ID code is set by cutting an electrical fuse of the ID circuit 13H of the IGBT 10H and so forth.

A method of reading the ID code out of the ID circuit 13H of the IGBT 10H in the power module via serial communication will be described by using FIG. 36 and FIG. 37. FIG. 36 is a block diagram illustrating one example of connection between the driver IC and the IGBT according to the eighth example. FIG. 37 is a timing chart illustrating one example of serial communication in the configuration illustrated in FIG. 36.

In a three-phase control structure, the ID circuits 13H of the upper arm side (high side) IGBTs 10H are cascaded such that the U-phase driver IC 20H, the U-phase ID circuit 13H, the V-phase ID circuit 13H, the W-phase ID circuit 13H and the driver IC 20H are connected together in this order. Likewise, the ID circuits 13H of the lower arm side (lower side) IGBTs 10H are cascaded such that the U-phase driver IC 20H, the U-phase ID circuit 13H, the V-phase ID circuit 13H, the W-phase ID circuit 13H and the driver IC 20H are connected together in this order. A serial clock signal (SCK) is output from a clock terminal of the driver IC 20H and is input into a clock terminal of the U-phase ID circuit 13H, a clock terminal of the V-phase ID circuit 13H and a clock terminal of the W-phase ID circuit 13H. Serial data is output from a data output terminal SO of the driver IC 20H and is input into a data input terminal DI_U of the U-phase ID circuit 13H. Serial data is output from a data output terminal DO_U of the U-phase ID circuit 13H and is input into a data input terminal DI_V of the V-phase ID circuit 13H. Serial data is output from a data output terminal DO_V of the V-phase ID circuit 13H and is input into a data input terminal DI_W of the W-phase ID circuit 13H. Serial data is output from a data output terminal DO_W of the W-phase ID circuit 13H and is input into a data input terminal SI of the driver IC 20H. Incidentally, although the V-phase driver IC 20H is connected with the switching element 11 and the temperature detection diode 12 of the U-phase IGBT 10H, the V-phase driver IC 20H is not connected with the ID circuit 13H of the U-phase IGBT 10H. In addition, although the W-phase driver IC 20H is connected with the switching element 11 and the temperature detection diode 12 of the W-phase IGBT 10H, the W-phase driver IC 20H is not connected with the ID circuit 13H of the W-phase IGBT 10H.

For example, each ID circuit 13H has a configuration that the ID code of a seven-bit length is set and serial data is transmitted from the driver IC 20H to the U-phase ID circuit 13H in order of TX(0), TX(1), . . . and TX(6). ID codes ID_U(0), ID_U(1), . . . and ID_U(6) are set in the U-phase ID circuit 13H and are transmitted to the V-phase ID circuit 13H in this order. ID codes ID_V(0), ID_V(1), . . . and ID_V(6) are set in the V-phase ID circuit 13H and are transmitted to the W-phase ID circuit 13H in this order. ID codes ID_W(0), ID_W(1), . . . and ID_W(6) are set in the W-phase ID circuit 13H and are transmitted to the driver IC 20H in this order. Thereby, it is possible to acquire data in order of the ID code of the W-phase IGBT, the ID code of the V-phase IGBGT, the ID code of the U-phase IGBT and output information of the CPU 31 by inputting the data into the CPU 31 from the data output terminal DO_W in synchronization with output of the serial signal from the CPU 31.

In addition, it is possible to perform signal synchronization (from which part the ID code begins) by outputting the output information from the CPU 31 in a specific pattern, confirming loading of the IGBT chip by a daisy-chain configuration and/or transmitting a known specific pattern from the CPU 31. In addition, it is also possible to confirm whether there is a deviation in data reading timing by using a TX(n) signal which has been lastly input from the CPU 31.

An acquiring method for the temperature characteristic data of the temperature detection diode 12 which is one process of a manufacturing method for the electronics device 1H according to the eighth example will be described by using FIG. 38.

FIG. 38 is a flowchart illustrating one example of processing of a temperature coefficient calculation unit according to the eighth example.

The manufacturing method for the electronics device 1H is the same as that in the second example with the exception that processes in step S27 and step S28 are different from those in the second example. In the following, the processes corresponding to step S27 and step S28 will be described.

First, the ID recognition unit 319H outputs the serial clock signal (SK) to the IGBT 10H in each phase via the driver IC 20H and outputs the serial data to the data input terminal DI_U of the U-phase IGBT 10H (step S271H). The ID recognition unit 319H reads the ID code of the IGBT 10H in each phase out of the output terminal DO_W of the W-phase IGBT 10H (step S27). Then, the ID recognition unit 319H acquires the temperature coefficient (K) from the external storage 46 in which the wafer measurement data library is stored by using the ID code of the IGBT 10H in each phase and stores the acquired temperature coefficient (K) into the memory 33 (step S28).

The operations of the electronics device 1H performed in normal operation are the same as those of the electronics device 1B. Incidentally, similarly to the second example, in normal operation of the electronics device 1H, the outside air temperature detector 44, the PC 45 and the external storage 46 are not used.

According to the eighth example, since only the driver IC in one phase is connected to the ID circuit of the IGBT concerned, it is possible to reduce the number of terminals to be installed and the number of pieces of connection wiring to be installed. The temperature characteristic data of the IGBT concerned may be stored into the ID circuit 13H in place of storage of the ID code peculiar to the IGBT concerned.

Although, in the foregoing, the present disclosure has been specifically described on the basis of the embodiment and examples of the present disclosure, it goes without saying that the present disclosure is not limited to the above-mentioned embodiment and examples and may be modified and altered in a variety of ways.

In the following, other embodiments will be described as appendixes

APPENDIX 1

A driving method for a power semiconductor device in which a switching element and a temperature detection diode are built
includes
(a) the step of preparing an electronics device in which temperature characteristic data of the temperature detection diode is stored,
(b) the step of driving the switching element,
(c) the step of detecting temperature information from the temperature detection diode,
(d) the step of detecting a temperature of the power semiconductor device on the basis of the temperature information and the temperature characteristic data,
(e) the step of, when the temperature detected in the step (d) exceeds a predetermined temperature, stopping or suppressing driving of the switching element, in which
the temperature characteristic data includes a temperature coefficient, a temperature of a first temperature environment and voltage information of the temperature detection diode in the first temperature environment.

APPENDIX 2

In the driving method for the power semiconductor device in the appendix 1,
the temperature characteristic data is
the one which has been calculated by
(a1) detecting the temperature of the first temperature environment,
(a2) detecting the voltage information of the temperature detection diode in the first temperature environment,
(a3) detecting a temperature of a second temperature environment,
(a4) detecting the voltage information of the temperature detection diode in the second temperature environment, and
(a5) on the basis of the temperature and the voltage information obtained in (a1) to (a4).

APPENDIX 3

In the driving method for the power semiconductor device in the appendix 1,
the temperature characteristic data is
the one which has been obtained by
(a1) detecting the temperature of the first temperature environment,
(a2) detecting the voltage information of the temperature detection diode in the first temperature environment,
(a3) recognizing identification information of the power semiconductor device concerned from the power semiconductor device, and
(a4) acquiring the temperature characteristic data corresponding to the identification information from an external storage.

APPENDIX 4

In the driving method for the power semiconductor device in the appendix 3,
the temperature characteristic data includes the temperature coefficient which has been obtained from tests performed in the first temperature environment and in the second temperature environment in wafer testing performed when the power semiconductor device concerned is manufactured.

APPENDIX 5

In the driving method for the power semiconductor device in the appendix 3,
the temperature characteristic data includes the temperature coefficient which has been obtained from tests performed in the first temperature environment and in the second temperature environment in wafer testing performed when the power semiconductor device concerned is manufactured, the voltage information of the temperature detection diode obtained in the first temperature environment and the voltage information of the temperature detection diode obtained in the second temperature environment.

APPENDIX 6

In the driving method for the power semiconductor device in the appendix 3,
the temperature characteristic data is
the one which has been obtained by,
(a5) when a difference between the voltage information obtained in (a2) and the voltage information of the temperature detection diode obtained in the first temperature environment in wafer testing is at least a predetermined value, correcting a temperature offset.

APPENDIX 7

In the driving method for the power semiconductor device in the appendix 1,
the temperature characteristic data is
the one which has been obtained by
(a1) detecting the temperature of the first temperature environment,
(a2) detecting the voltage information of the temperature detection diode in the first temperature environment, and
(a3) acquiring the temperature characteristic data of the temperature detection diode concerned from power semiconductor device.

APPENDIX 8

In the driving method for the power semiconductor device in the appendix 7,
the temperature characteristic data includes the temperature coefficient which has been obtained from tests performed in the first temperature environment and in the second temperature environment in wafer testing performed when the power semiconductor device concerned is manufactured, or the voltage information of the temperature detection diode obtained in the first temperature environment and the voltage information of the temperature detection diode obtained in the second temperature environment.

APPENDIX 9

A manufacturing method for an electronics device includes
(a) a process of preparing a power semiconductor device in which a switching element and a temperature detection diode are built, a first semiconductor integrated circuit device which includes a gate circuit for driving the switching element and a second semiconductor integrated circuit device which includes a control unit for controlling the gate circuit and an electrically rewritable nonvolatile memory, and
(b) a process of acquiring temperature characteristic data of the temperature detection diode.

APPENDIX 10

In the manufacturing method for the electronics device in the appendix 9,
the process (b)
includes
(b1) the step of detecting a temperature of a first temperature environment and storing the temperature so detected into the nonvolatile memory,
(b2) the step of detecting voltage information of the temperature detection diode in the first temperature environment and storing the voltage information so detected into the nonvolatile memory,
(b3) the step of detecting a temperature of a second temperature environment,
(b4) the step of detecting voltage information of the temperature detection diode in the second temperature environment, and
(b5) the step of acquiring the temperature characteristic data on the basis of the temperature and the voltage information obtained in the steps (b1) to (b4) and storing the temperature characteristic data so acquired into the nonvolatile memory.

APPENDIX 11

In the manufacturing method for the electronics device In the appendix 9,
the process (b)
includes
(b1) the step of detecting a temperature of a first temperature environment and storing the temperature so detected into the nonvolatile memory,
(b2) the step of detecting voltage information of the temperature detection diode in the first temperature environment and storing the voltage information so detected into the nonvolatile memory,
(b3) the step of recognizing identification information of the power semiconductor device concerned from the power semiconductor device, and
(b4) the step of acquiring temperature characteristic data corresponding to the identification information from an external database and storing the temperature characteristic data so acquired into the nonvolatile memory.

APPENDIX 12

In the manufacturing methods for the electronics device in the appendix 10,
the temperature characteristic data includes a temperature coefficient which has been obtained from tests performed in the first temperature environment and in the second temperature environment in wafer testing performed when the power semiconductor device concerned is manufactured.

APPENDIX 13

In the manufacturing method for the electronics device in the appendix 11,
the temperature characteristic data includes a temperature coefficient which has been obtained from tests performed in the first temperature environment and in the second temperature environment in wafer testing performed when the power semiconductor device concerned is manufactured, the voltage information of the temperature detection diode obtained in the first temperature environment and the voltage information of the temperature detection diode obtained in the second temperature environment.

APPENDIX 14

In the manufacturing method for the electronics device in the appendix 13,
the process (b) further includes
(b5) the step of, when a difference between the voltage information obtained in the atop (a2) and the voltage information of the temperature detection diode obtained in the first temperature environment in wafer testing is at least a predetermined value, correcting a temperature offset.

APPENDIX 15

In the manufacturing method for the electronics device in the appendix 9,
the process (b) includes
(b1) the step of detecting a temperature of a first temperature environment and storing the temperature so detected into the nonvolatile memory,
(b2) the step of detecting voltage information of the temperature detection diode in the first temperature environment and storing the voltage information so detected into the nonvolatile memory, and
(b3) the step of acquiring the temperature characteristic data of the temperature detection diode concerned from the power semiconductor device and storing the temperature characteristic data so acquired into the nonvolatile memory.

APPENDIX 16

In the manufacturing method for the electronics device in the appendix 15,
the temperature characteristic data includes a temperature coefficient which has been obtained from normal temperature and high temperature tests in wafer testing performed when the power semiconductor device concerned is manufactured, or the voltage information of the temperature detection diode obtained in the first temperature environment and the voltage information of the temperature detection diode obtained in the second temperature environment.

What is claimed is:

1. A driving method for a power semiconductor device in which a switching element and a temperature detection diode are built, comprising:
   (a) a step of preparing an electronics device in which temperature characteristic data of the temperature detection diode is stored;
   (b) a step of driving the switching element;
   (c) a step of detecting temperature information from the temperature detection diode;
   (d) a step of detecting a temperature of the power semiconductor device on the basis of the temperature information and the temperature characteristic data; and
   (e) a step of stopping or suppressing driving of the switching element when the temperature detected in step (d) exceeds a predetermined temperature,
   wherein the temperature characteristic data includes a temperature coefficient, a temperature of a first temperature environment and voltage information of the temperature detection diode in the first temperature environment, and
   wherein the temperature coefficient is obtained from tests performed in the first temperature environment and in a second temperature environment in wafer testing performed when the power semiconductor device is manufactured.

2. The driving method for the power semiconductor device according to claim 1,
   wherein the temperature coefficient is calculated on the basis of the temperature and voltage information obtained by:
   (a1) detecting the temperature of the first temperature environment;
   (a2) detecting the voltage information of the temperature detection diode in the first temperature environment;
   (a3) detecting a temperature of the second temperature environment; and
   (a4) detecting the voltage information of the temperature detection diode in the second temperature environment.

3. The driving method for the power semiconductor device according to claim 2, the method further comprises:
   (f) setting the power semiconductor device in the first temperature environment;
   (g) detecting the voltage information of the temperature detection diode in the first temperature environment; and
   (h) calculating
   a temperature offset when a difference between the voltage information obtained in (g) and the voltage information of the temperature detection diode obtained in the first temperature environment in wafer testing is greater than a predetermined value.

4. The driving method for the power semiconductor device according to claim 1,
   wherein the temperature characteristic data is obtained by:
   (a1) recognizing identification information of the power semiconductor device from the power semiconductor device; and
   (a2) acquiring the temperature characteristic data corresponding to the identification information from an external storage.

\* \* \* \* \*